US010109662B2

United States Patent
Lee et al.

(10) Patent No.: US 10,109,662 B2
(45) Date of Patent: Oct. 23, 2018

(54) GATE-CONTROLLED CHARGE MODULATED DEVICE FOR CMOS IMAGE SENSORS

(71) Applicant: Stratio Inc., Menlo Park, CA (US)

(72) Inventors: Jae Hyung Lee, Palo Alto, CA (US); Yeul Na, Santa Clara, CA (US); Youngsik Kim, Palo Alto, CA (US); Woo-Shik Jung, Sunnyvale, CA (US)

(73) Assignee: Stratio, Inc., San Jose, CA (US)

( * ) Notice: Subject to any disclaimer, the term of this patent is extended or adjusted under 35 U.S.C. 154(b) by 356 days.

(21) Appl. No.: 14/967,262

(22) Filed: Dec. 11, 2015

(65) Prior Publication Data

US 2016/0099372 A1  Apr. 7, 2016

Related U.S. Application Data

(63) Continuation of application No. PCT/US2014/043421, filed on Jun. 20, 2014.
(Continued)

(51) Int. Cl.
*H01L 27/146* (2006.01)
*H01L 31/113* (2006.01)
(Continued)

(52) U.S. Cl.
CPC .... *H01L 27/14616* (2013.01); *H01L 31/1136* (2013.01); *H01L 31/1804* (2013.01); *H04N 5/378* (2013.01)

(58) Field of Classification Search
CPC ........... H01L 31/1136; H01L 27/14616; H01L 31/1804; H01L 27/14612; H04N 5/378
See application file for complete search history.

(56) References Cited

U.S. PATENT DOCUMENTS 3,648,125 A    3/1972 Peltzer
4,819,071 A *  4/1989 Nakamura ............. H04N 5/361
                                              257/291
(Continued)

FOREIGN PATENT DOCUMENTS

JP    S50-116290    9/1975
JP    H08-78653     3/1996
(Continued)

OTHER PUBLICATIONS

Stratio, Inc., Extended European Search Report, EP14814462.9, dated Jan. 26, 2017, 7 pgs.
(Continued)

*Primary Examiner* — Que T Le
*Assistant Examiner* — Jennifer Bennett
(74) *Attorney, Agent, or Firm* — Morgan, Lewis & Bockius LLP

(57) ABSTRACT

A device for sensing light includes a first semiconductor region doped with a dopant of a first type and a second semiconductor region doped with a dopant of a second type. The second semiconductor region is positioned above the first semiconductor region. The device includes a gate insulation layer; a gate, a source, and a drain. The second semiconductor region has a top surface that is positioned toward the gate insulation layer and a bottom surface that is positioned opposite to the top surface of the second semiconductor region. The second semiconductor region has an upper portion that includes the top surface of the second semiconductor region and a lower portion that includes the bottom surface of the second semiconductor region and is mutually exclusive with the upper portion. The first semiconductor region is in contact with both the upper portion and the lower portion of the second semiconductor region.

20 Claims, 14 Drawing Sheets

Related U.S. Application Data

(60) Provisional application No. 62/002,045, filed on May 22, 2014, provisional application No. 61/837,557, filed on Jun. 20, 2013.

(51) Int. Cl.
*H04N 5/378* (2011.01)
*H01L 31/18* (2006.01)

(56) References Cited

U.S. PATENT DOCUMENTS

| | | | |
|---|---|---|---|
| 4,882,609 A * | 11/1989 | Schubert | B82Y 20/00 257/105 |
| 5,424,223 A | 6/1995 | Hynecek | |
| 6,291,314 B1 | 9/2001 | Henley et al. | |
| 7,595,243 B1 | 9/2009 | Bulucea et al. | |
| 2003/0153163 A1 | 8/2003 | Letertre et al. | |
| 2003/0234432 A1 | 12/2003 | Song et al. | |
| 2003/0234759 A1 | 12/2003 | Bergquist | |
| 2004/0224482 A1 | 11/2004 | Kub et al. | |
| 2006/0205180 A1 | 9/2006 | Henley et al. | |
| 2006/0234474 A1 | 10/2006 | Natassi et al. | |
| 2007/0004067 A1 * | 1/2007 | Hsu | H01L 31/1136 438/29 |
| 2010/0171126 A1 | 7/2010 | Briere | |
| 2010/0273329 A1 | 10/2010 | Prabhu et al. | |
| 2011/0204382 A1 | 8/2011 | Traut et al. | |
| 2012/0092536 A1 * | 4/2012 | Hirota | H01L 27/14645 348/294 |
| 2012/0138919 A1 | 6/2012 | Lan et al. | |
| 2013/0154049 A1 | 6/2013 | Imthurn et al. | |
| 2014/0092287 A1 * | 4/2014 | Jin | H04N 5/3745 348/301 |
| 2014/0264501 A1 * | 9/2014 | Na | H01L 31/062 257/290 |

FOREIGN PATENT DOCUMENTS

| | | |
|---|---|---|
| JP | 2005-530217 | 10/2005 |
| JP | 2001-0094106 A | 4/2006 |
| JP | 2011-134784 | 7/2011 |

OTHER PUBLICATIONS

Stratio, Inc., Communication Pursuant to Rules 70(2) and 70a(2), EP14814462.9, dated Feb. 14, 2017, 1 pg.

Stratio, Inc., First Office Action, JP2016521846, dated Sep. 27, 2016, 6 pgs.

Stratio, Inc., Final Office Action, JP2016521846, dated Jun. 13, 2017, 12 pgs.

Stratio, Inc., Communication Pursuant to Rules 161(2) and 162-EPC, EP14814462.9, dated Feb. 4, 2016, 2 pgs.

Stratio, Inc., Invitation to Pay Additional Fees, PCTUS2014/043421, Oct. 3, 2014, 2 pgs.

Stratio, Inc., International Search Report and Written Opinion, PCTUS2014/043421, dated Dec. 9, 2014, 13 pgs.

Stratio, Inc., International Preliminary Report on Patentability, PCTUS2014/043421, dated Dec. 22, 2015, 10 pgs.

Stratio, Inc., Invitation to Pay Additional Fees, PCTUS2014/068179, Feb. 12, 2015, 2 pgs.

Stratio, Inc., International Search Report and Written Opinion, PCTUS2014/068179, dated Apr. 23, 2015, 11 pgs.

Stratio, Inc., International Preliminary Report on Patentability, PCTUS2014/068179, dated Jun. 7, 2016, 7 pgs.

Stratio, Inc., International Search Report and Written Opinion, PCTUS2015/052410, dated Feb. 2, 2016, 12 pgs.

Stratio, Inc., Decision to Grant a Patent, JP2016521846, dated Feb. 19, 2018, 6 pgs.

Stratio, Inc., 1st Office Action, CN201480046278.0, dated Sep. 5, 2017, 29 pgs.

Stratio, Inc., Certificate of Patent, JP2016521846, dated Apr. 20, 2018, 2 pgs.

* cited by examiner

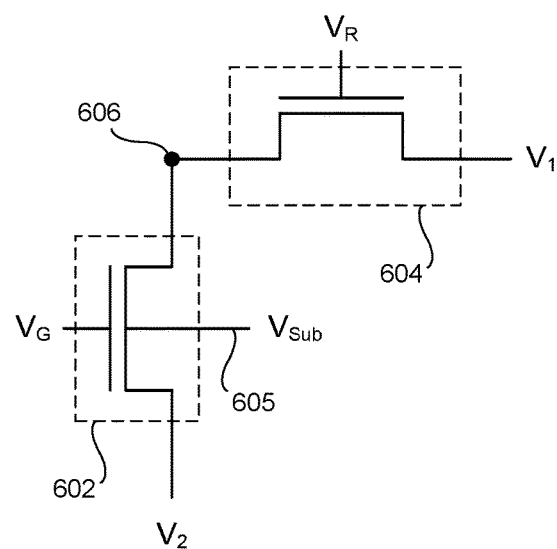
Figure 6
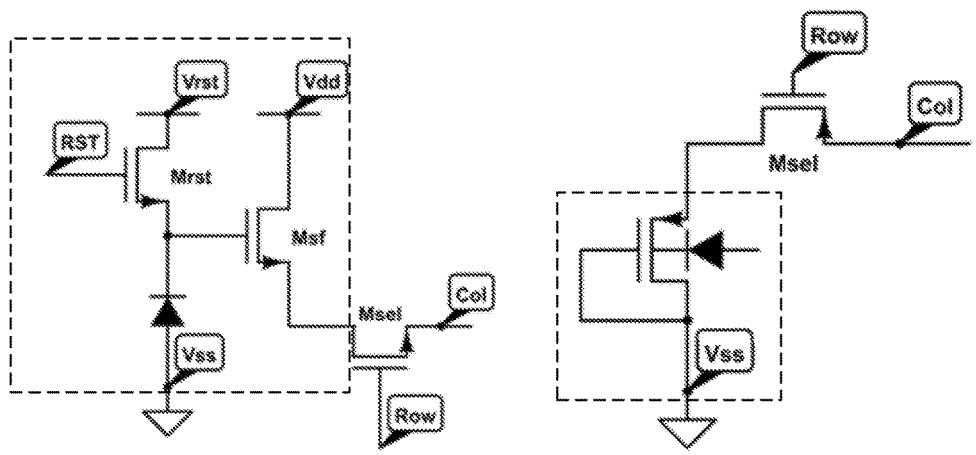
Figure 7A
Figure 7B

GATE-CONTROLLED CHARGE MODULATED DEVICE FOR CMOS IMAGE SENSORS

RELATED APPLICATIONS

This application is a continuation application of the international application number PCT/US2014/043421, filed Jun. 20, 2014, which claims priority to U.S. Provisional Patent Application Ser. No. 61/837,557, filed Jun. 20, 2013 and U.S. Provisional Patent Application Ser. No. 62/002,045, filed May 22, 2014. All of these applications are incorporated by reference herein in their entireties.

TECHNICAL FIELD

This application relates generally to semiconductor devices and circuits. More particularly, the disclosed embodiments relate to semiconductor devices and circuits for sensing short-wave infrared light.

BACKGROUND

Digital image sensors have gained significant popularity in recent years. For example, many digital cameras, mobile computers, and mobile phones include digital image sensors for capturing images.

However, traditional digital image sensors, such as complementary metal-oxide-semiconductor (CMOS) sensors, utilize photodiodes and suffer from dark current associated with photodiodes. The dark current contributes to increased shot noise, which is undesirable.

Although a charge modulation device (CMD) has been proposed as a solution to the dark current problem, charge modulation devices suffer from a small change in on/off signals. In addition, charge modulation devices are limited with a trade-off of a quantum efficiency and a weak channel modulation.

SUMMARY

Thus, there is a need for an optical sensor that has a low dark current, a high quantum efficiency, and a strong channel modulation.

A number of embodiments (e.g., of server systems, client systems or devices, and methods of operating such systems or devices) that overcome the limitations and disadvantages described above are presented in more detail below. These embodiments provide devices, circuits, and methods for making and using devices, for sensing infrared light.

As described in more detail below, some embodiments involve a device for sensing light. The device includes a first semiconductor region doped with a dopant of a first type and a second semiconductor region doped with a dopant of a second type. The second semiconductor region is positioned above the first semiconductor region; and the first type is distinct from the second type. The device includes a gate insulation layer positioned above the second semiconductor region; a gate positioned above the gate insulation layer; a source electrically coupled with the second semiconductor region; and a drain electrically coupled with the second semiconductor region. The second semiconductor region has a top surface that is positioned toward the gate insulation layer, and the second semiconductor region has a bottom surface that is positioned opposite to the top surface of the second semiconductor region. The second semiconductor region has an upper portion that includes the top surface of the second semiconductor region. The second semiconductor region also has a lower portion that includes the bottom surface of the second semiconductor region and is mutually exclusive with the upper portion. The first semiconductor region is in contact with both the upper portion and the lower portion of the second semiconductor region. The first semiconductor region is in contact with the upper portion of the second semiconductor region at least at a location positioned under the gate.

In some embodiments, the first type is an n-type and the second type is a p-type.

In some embodiments, the first type is a p-type and the second type is an n-type.

In some embodiments, the second semiconductor region has a first lateral surface that extends from the source to the drain and is distinct from the top surface and the bottom surface. The second semiconductor region has a second lateral surface that extends from the source to the drain and is distinct from the top surface and the bottom surface. The first semiconductor region is in contact with the upper portion of the second semiconductor region through a portion of the first lateral surface. The first semiconductor region is in contact with the upper portion of the second semiconductor region through a portion of the second lateral surface.

In some embodiments, the first semiconductor region includes germanium.

In some embodiments, the second semiconductor region includes germanium.

In some embodiments, the gate insulation layer includes an oxide layer.

In some embodiments, the device includes a substrate insulation layer positioned below the first semiconductor region. The substrate insulation layer includes one or more of: $SiO_2$, $GeO_x$, $ZrO_x$, $HfO_x$, $Si_xN_y$, $Si_xO_yN_z$, $Ta_xO_y$, $Sr_xO_y$, and $Al_xO_y$.

In some embodiments, the device includes a third semiconductor region that includes germanium doped with a dopant of the second type. The third semiconductor region is positioned below the first semiconductor region.

In some embodiments, a doping concentration of the dopant of the second type in the second semiconductor region is higher than a doping concentration of the dopant of the second type in the third semiconductor region.

In some embodiments, the device includes a silicon substrate.

In some embodiments, the gate includes one or more of: polygermanium, amorphous germanium, polysilicon, amorphous silicon, silicon carbide, and metal.

In some embodiments, the second semiconductor region extends from the source to the drain.

In some embodiments, the first semiconductor region extends from the source to the drain.

In some embodiments, the gate insulation layer extends from the source to the drain.

In some embodiments, the second semiconductor region defines multiple channels between the source and the drain.

In some embodiments, the second semiconductor region has a thickness less than 100 nm.

In some embodiments, the first semiconductor region has a thickness less than 1000 nm.

In accordance with some embodiments, a sensor array includes a plurality of devices formed on a common silicon substrate, wherein each device of the plurality of devices corresponds to any of the above-described devices.

In some embodiments, the plurality of devices has the first semiconductor region on a common plane.

In some embodiments, the plurality of devices has the second semiconductor region on a common plane.

In some embodiments, the plurality of devices has the third semiconductor region on a common plane.

In some embodiments, the plurality of devices is separated by one or more trenches.

In some embodiments, the plurality of devices is positioned on separate germanium islands formed on the common silicon substrate.

In some embodiments, the sensor array includes a passivation layer over the plurality of devices.

In some embodiments, the sensor array includes a passivation layer between the plurality of devices.

In accordance with some embodiments, a method of forming a device for sensing light includes forming a first semiconductor region, above a silicon substrate, doped with a dopant of a first type and forming a second semiconductor region, above the silicon substrate, doped with a dopant of a second type. The second semiconductor region is positioned above the first semiconductor region. The first type is distinct from the second type. The method also includes forming a gate insulation layer above the second semiconductor region. One or more portions of the second semiconductor region are exposed from the gate insulation layer to define a source and a drain. The second semiconductor region has a top surface that faces the gate insulation layer. The second semiconductor region has a bottom surface that is opposite to the top surface of the second semiconductor region. The second semiconductor region has an upper portion that includes the top surface of the second semiconductor region. The second semiconductor region has a lower portion that includes the bottom surface of the second semiconductor region and is mutually exclusive with the upper portion. The first semiconductor region is in contact with both the upper portion and the lower portion of the second semiconductor region. The first semiconductor region is in contact with the upper portion of the second semiconductor region at least at a location positioned under the gate. The method further includes forming a gate positioned above the gate insulation layer.

In some embodiments, the first semiconductor region is formed by epitaxially growing the first semiconductor region.

In some embodiments, the first semiconductor region is doped in-situ with the dopant of the first type while the first semiconductor region is grown.

In some embodiments, the first semiconductor region is doped with the dopant of the first type using an ion implantation process or a gas phase diffusion process.

In some embodiments, the second semiconductor region is formed by epitaxially growing the second semiconductor region.

In some embodiments, the second semiconductor region is doped in-situ with the dopant of the second type while the second semiconductor region is grown.

In some embodiments, the second semiconductor region is doped with the dopant of the second type using an ion implantation process or a gas phase diffusion process.

In some embodiments, the second semiconductor region is doped with the dopant of the second type using an ion implantation process after the first semiconductor region is doped with the dopant of the first type using an ion implantation process or a gas phase diffusion process.

In accordance with some embodiments, a method of forming a sensor array includes concurrently forming a plurality of devices on a common silicon substrate using any of the above-described methods.

In accordance with some embodiments, a sensor circuit includes a photo-sensing element, the photo-sensing element having a source terminal, a gate terminal, a drain terminal, and a body terminal. The sensor circuit also includes a selection transistor having a source terminal, a gate terminal, and a drain terminal. The drain terminal of the selection transistor is electrically coupled with the source terminal of the photo-sensing element or the source terminal of the selection transistor is electrically coupled with the drain terminal of the photo-sensing element.

In some embodiments, the photo-sensing element is any of the above-described devices.

In some embodiments, the source terminal or the drain terminal, of the photo-sensing element, that is not electrically coupled with the source terminal or the drain terminal of the selection transistor is connected to a ground.

In some embodiments, the source terminal or the drain terminal, of the photo-sensing element, that is electrically coupled with the source terminal or the drain terminal of the selection transistor is not connected to a ground.

In some embodiments, the source terminal or the drain terminal, of the photo-sensing element, that is electrically coupled with the source terminal or the drain terminal of the selection transistor is electrically coupled with a voltage source.

In some embodiments, the voltage source provides a fixed voltage.

In some embodiments, the sensor circuit includes no more than two transistors, the two transistors including the selection transistor.

In some embodiments, the sensor circuit includes no more than one transistor, the one transistor being the selection transistor.

In accordance with some embodiments, a converter circuit includes a first transimpedance amplifier having an input terminal electrically coupled with the source terminal or the drain terminal, of the selection transistor of a first sensor circuit that corresponds to any of the above-described sensor circuits, that is not electrically coupled with the source terminal or the drain terminal of the photo-sensing element. The first transimpedance amplifier is configured to convert a current input from the photo-sensing element into a voltage output. The converter circuit also includes a differential amplifier having two input terminals, a first input terminal of the two input terminals electrically coupled with the voltage output of the first transimpedance amplifier and a second input terminal of the two input terminals electrically coupled with a voltage source that is configured to provide a voltage corresponding to a base current provided by the photo-sensing element. The differential amplifier is configured to output a voltage based on a voltage difference between the voltage output and the voltage provided by the voltage source.

In some embodiments, the first transimpedance amplifier includes an operational amplifier.

In some embodiments, the base current corresponds to a current provided by the photo-sensing element while the photo-sensing element receives substantially no light.

In some embodiments, the voltage source is a second transimpedance amplifier having an input terminal electrically coupled with a second sensor circuit that corresponds to any of the above-described sensor circuits and is distinct from the first sensor circuit.

In some embodiments, the input terminal of the second transimpedance amplifier is electrically coupled with the source terminal or the drain terminal of the selection transistor of the second sensor circuit.

In some embodiments, the second transimpedance amplifier includes an operational amplifier.

In some embodiments, the photo-sensing element of the second sensor circuit is optically covered so that the photo-sensing element of the second sensor circuit is prevented from receiving light.

In some embodiments, the voltage source is a digital-to-analog converter.

In some embodiments, the converter circuit includes an analog-to-digital converter electrically coupled to an output of the differential amplifier, the analog-to-digital converter configured to convert the output of the differential amplifier into a digital signal.

In some embodiments, the first transimpedance amplifier is configured to electrically couple with a respective sensor circuit of a plurality of sensor circuits through a multiplexer.

In accordance with some embodiments, an image sensor device includes an array of sensors. A respective sensor in the array of sensors includes any of the above-described sensor circuits.

In some embodiments, the image sensor device includes any of the above-described converter circuits.

In some embodiments, the array of sensors includes multiple rows of sensors; and, for sensors in a respective row, gate terminals of selection transistors are electrically coupled to a common selection line.

In some embodiments, the array of sensors includes multiple columns of sensors; and, for sensors in a respective column, one of source terminals or drain terminals of selection transistors are electrically coupled to a common column line.

In accordance with some embodiments, a method includes exposing the photo-sensing element of any of the above-described sensor circuits. The method also includes providing a fixed voltage to the source terminal of the photo-sensing element; and measuring a drain current of the photo-sensing element.

In some embodiments, the method includes determining an intensity of the light based on the drain current of the photo-sensing element.

In some embodiments, measuring the drain current includes converting the drain current to a voltage signal.

In some embodiments, converting the drain current to the voltage signal includes using a transimpedance amplifier to convert the drain current to the voltage signal.

In some embodiments, measuring the drain current includes using any of the above-described converter circuits.

In some embodiments, the method includes activating the selection transistor of the sensor circuit.

In some embodiments, the fixed voltage is provided to the source terminal of the photo-sensing element prior to exposing the photo-sensing element to light.

In some embodiments, the fixed voltage is provided to the source terminal of the photo-sensing element subsequent to exposing the photo-sensing element to light.

In accordance with some embodiments, a method includes exposing the array of sensors of any of the above-described image sensor devices to a pattern of light. The method also includes, for a photo-sensing element of a respective sensor in the array of sensors, providing a respective voltage to the source terminal of the photo-sensing element of the respective sensor; and measuring a drain current of the photo-sensing element.

In some embodiments, the source terminals of the photo-sensing elements in the array of sensors concurrently receive respective voltages.

In some embodiments, the source terminals of the photo-sensing elements in the array of sensors sequentially receive respective voltages.

In some embodiments, the source terminals of photo-sensing elements in the array of sensors receive a same voltage.

In some embodiments, the drain currents of the photo-sensing elements in the array of sensors are measured in batches.

In some embodiments, the drain currents of the photo-sensing elements in the array of sensors are concurrently measured.

In some embodiments, the drain currents of the photo-sensing elements in the array of sensors are sequentially measured.

BRIEF DESCRIPTION OF THE DRAWINGS

For a better understanding of the aforementioned aspects as well as additional aspects and embodiments thereof, reference should be made to the Description of Embodiments below, in conjunction with the following drawings.

FIG. 6 illustrates an exemplary sensor circuit in accordance with some embodiments.

FIG. 7A illustrates an exemplary 3T-APS circuit in accordance with some embodiments.

FIG. 7B illustrates an exemplary 1T-MAPS circuit in accordance with some embodiments.

Like reference numerals refer to corresponding parts throughout the figures.

Figure 1A:
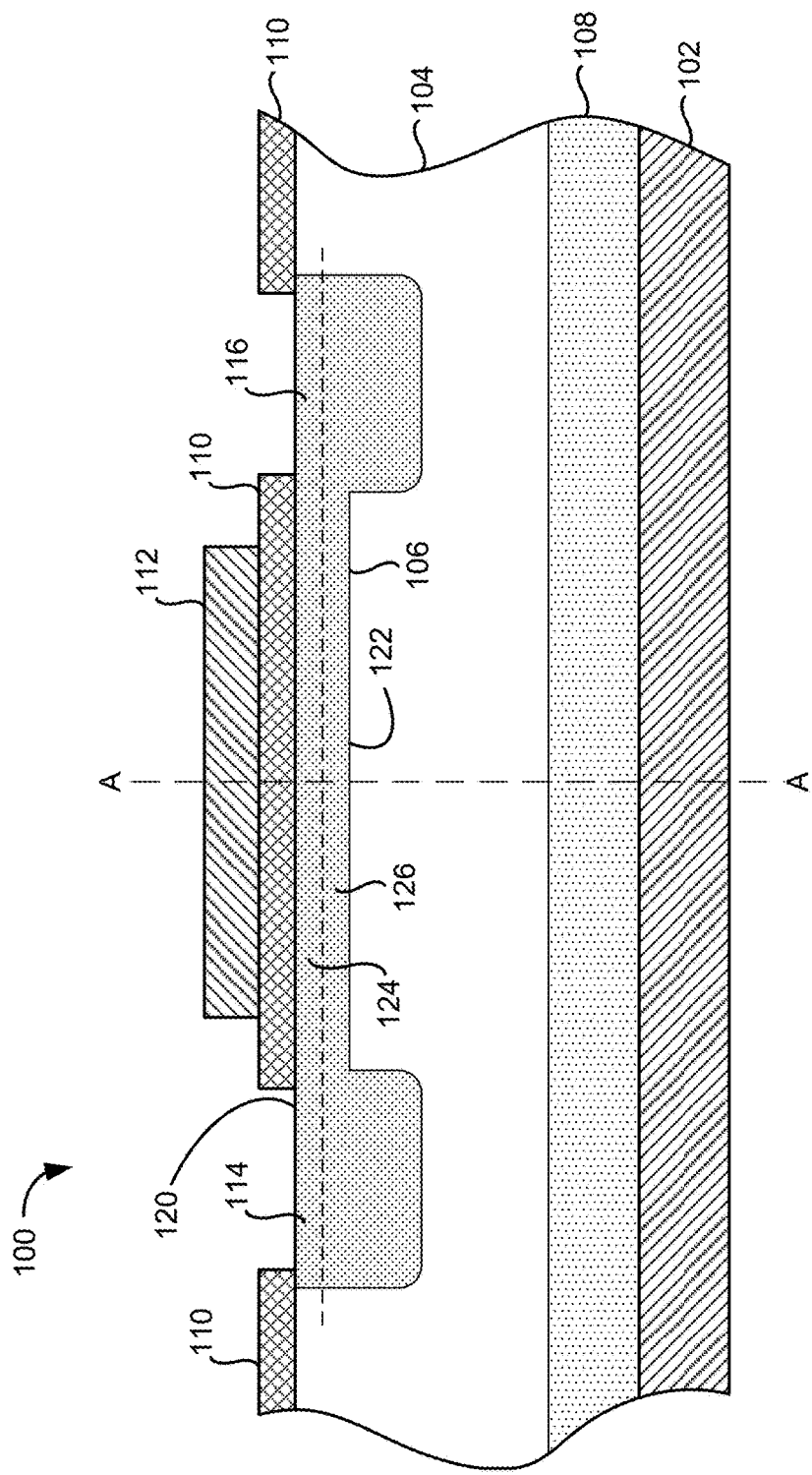
FIG. 1A is a partial cross-sectional view of a semiconductor optical sensor device in accordance with some embodiments.

Unless noted otherwise, the figures are not drawn to scale.

DESCRIPTION OF EMBODIMENTS

As explained above, traditional optical sensors, such as complementary metal-oxide-semiconductor (CMOS) sensors and charge modulation devices, suffer from dark current and a trade-off between a quantum efficiency and a weak channel modulation.

In addition, the problems are exacerbated when short-wave infrared light is to be detected. Traditional sensors made of silicon are not adequate for sensing and imaging short-wave infrared light (e.g., light within a wavelength range of 1400 nm to 3000 mm), because silicon is deemed to be transparent to light having a wavelength longer than 1100 nm (which corresponds with the bandgap of silicon).

Infrared sensors made of Indium Gallium Arsenide (In-GaAs) and Germanium (Ge) suffer from high dark current. Many InGaAs and sensors are cooled to operate in a low temperature (e.g., −70° C.). However, cooling is disadvantageous for many reasons, such as cost of the cooling unit, an increased size of the device due to the cooling unit, an increased operation time for cooling the device, and increased power consumption for cooling the device.

Devices, circuits, and methods that address the above problems are described herein. By providing a structure that allows transport of photo-generated carriers toward a gate insulation layer, the charge modulation effect is significantly increased compared to conventional charge modulation devices while maintaining a high quantum efficiency. The structures described herein when implemented using material that are better suited for detecting short-wave infrared light than silicon (e.g., germanium) can provide improved performance (e.g., lower noise, higher quantum efficiency, and higher on/off signal ratio) in detecting short-wave infrared light.

For these reasons, the structures described herein are particularly useful for detecting short-wave infrared light. However, such structures may be used for detecting visible light.

Reference will be made to certain embodiments, examples of which are illustrated in the accompanying drawings. While the underlying principles will be described in conjunction with the embodiments, it will be understood that it is not intended to limit the scope of claims to these particular embodiments alone. On the contrary, the claims are intended to cover alternatives, modifications and equivalents that are within the scope of the claims.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well-known to those of ordinary skill in the art are not described in detail to avoid obscuring aspects of the underlying principles.

It will also be understood that, although the terms first, second, etc. may be used herein to describe various elements, these elements should not be limited by these terms. These terms are only used to distinguish one element from another. For example, a first semiconductor region could be termed a second semiconductor region, and, similarly, a second semiconductor region could be termed a first semiconductor region, without departing from the scope of the claims. The first semiconductor and the second semiconductor region are both semiconductor regions, but they are not the same semiconductor regions.

The terminology used in the description of the embodiments herein is for the purpose of describing particular embodiments only and is not intended to limiting of the scope of claims. As used in the description and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1A is a partial cross-sectional view of a semiconductor optical sensor device 100 in accordance with some embodiments.

In some embodiments, the device 100 is called a gate-controlled charge modulated device (GCMD).

The device 100 includes a first semiconductor region 104 doped with a dopant of a first type (e.g., an n-type semiconductor, such as phosphorus or arsenic) and a second semiconductor region 106 doped with a dopant of a second type (e.g., a high concentration of a p-type semiconductor, such as boron, which is often indicated using a p+ symbol). The second semiconductor region 106 is positioned above the first semiconductor region 104. The first type (e.g., n-type) is distinct from the second type (e.g., p-type). In some embodiments, the second semiconductor region 106 is positioned over the first semiconductor region 104.

The device includes a gate insulation layer 110 positioned above the second semiconductor region 106 and a gate 112 positioned above the gate insulation layer 110. In some embodiments, the gate insulation layer 110 is positioned over the second semiconductor region 106. In some embodiments, the gate insulation layer 110 is in contact with the second semiconductor region 106. In some embodiments, the gate 112 positioned over the gate insulation layer 110. In some embodiments, the gate 112 is in contact with the gate insulation layer 110.

The device also includes a source 114 electrically coupled with the second semiconductor region 106 and a drain 116 electrically coupled with the second semiconductor region 106.

The second semiconductor region 106 has a top surface 120 that is positioned toward the gate insulation layer 110. The second semiconductor region 106 also has a bottom surface 122 that is positioned opposite to the top surface 120 of the second semiconductor region 106. The second semiconductor region 106 has an upper portion 124 that includes the top surface 120 of the second semiconductor region 106. The second semiconductor region 106 also has a lower portion 126 that includes the bottom surface 122 of the second semiconductor region 106. The lower portion 126 is mutually exclusive with the upper portion 124. As used herein, the upper portion 124 and the lower portion 126 refer to different portions of the second semiconductor region 106. Thus, in some embodiments, there is no physical separation of the upper portion 124 and the lower portion 126. In some embodiments, the lower portion 126 refers to a portion of the second semiconductor region 106 that is not the upper portion 124. In some embodiments, the upper portion 124 has a thickness less than 1 nm, 2 nm, 3 nm, 4 nm, 5 nm, 6 nm, 7 nm, 8 nm, 9 nm, or 10 nm. In some embodiments, the upper portion 124 has a uniform thickness from the source 114 to the drain 116. In some embodiments, the upper portion 124 and the lower portion 126 have a same thickness at a horizontal location directly below the gate 112.

In some embodiments, the first type is an n-type and the second type is a p-type. For example, the first semiconductor region is doped with an n-type semiconductor and the source 114, the drain 116, and a channel between the source 114 and the drain 116 are doped with a p-type semiconductor, which is called a PMOS structure.

In some embodiments, the first type is a p-type and the second type is an n-type. For example, the first semiconductor region is doped with a p-type semiconductor and the source 114, the drain 116, and a channel between the source 114 and the drain 116 are doped with an n-type semiconductor, which is called an NMOS structure.

In some embodiments, the first semiconductor region 104 includes germanium. In some embodiments, the second semiconductor region 106 includes germanium. The direct band gap energy of germanium is around 0.8 eV at room temperature, which corresponds to a wavelength of 1550 nm. Thus, a semiconductor optical sensor device that includes germanium (e.g., in the first and second semiconductor regions) is more sensitive to short-wave infrared light than a semiconductor optical sensor device that includes silicon only (e.g., without germanium).

In some embodiments, the gate insulation layer 110 includes an oxide layer (e.g., $SiO_2$, $GeO_x$, $ZrO_x$, $HfO_x$, $Si_xN_y$, $Si_xO_yN_z$, $Ta_xO_y$, $Sr_xO_y$, or $Al_xO_y$). In some embodiments, the gate insulation layer 110 includes an oxynitride layer (e.g., SiON). In some embodiments, the gate insulation layer 110 includes a high-κ dielectric material, such as $HfO_2$, HfSiO, or $Al_2O_3$.

In some embodiments, the device includes a substrate insulation layer 108 positioned below the first semiconductor region 104. The substrate insulation layer includes one or more of: $SiO_2$, $GeO_x$, $ZrO_x$, $HfO_x$, $Si_xN_y$, $Si_xO_yN_z$, $Ta_xO_y$, $Sr_xO_y$, and $Al_xO_y$. In some embodiments, the substrate insulation layer 108 includes a high-κ dielectric material. In some embodiments, the first semiconductor region 104 is positioned over the substrate insulation layer 108. In some embodiments, the first semiconductor region 104 is in contact with the substrate insulation layer 108. In some embodiments, the substrate insulation layer 108 is positioned over the substrate 102 (e.g., a silicon substrate). In some embodiments, the substrate insulation layer 108 is in contact with the substrate 102.

In some embodiments, the device includes a third semiconductor region 108 that includes germanium doped with a dopant of the second type (e.g., p-type). The third semiconductor region 108 is positioned below the first semiconductor region 104.

In some embodiments, a doping concentration of the dopant of the second type in the second semiconductor region 106 is higher than a doping concentration of the dopant of the second type in the third semiconductor region 108. For example, the second semiconductor region 106 has a p+ doping (e.g., at a concentration of one dopant atom per ten thousand atoms or more) and the third semiconductor region 108 has a p doping (e.g., at a concentration of one dopant atom per hundred million atoms).

In some embodiments, the device includes a silicon substrate 102. For example, the third semiconductor region 108, the first semiconductor region 104, and the second semiconductor region 106 are formed over the silicon substrate 102.

In some embodiments, the gate 112 includes one or more of: polysilicon, amorphous silicon, silicon carbide, and metal. In some embodiments, the gate 112 consists of one or more of: polygermanium, amorphous germanium, polysilicon, amorphous silicon, silicon carbide, and metal.

In some embodiments, the second semiconductor region 106 extends from the source 114 to the drain 116.

In some embodiments, the first semiconductor region 104 extends from the source 114 to the drain 116.

In some embodiments, the gate insulation layer 110 extends from the source 114 to the drain 116.

In some embodiments, the second semiconductor region 106 has a thickness less than 100 nm. In some embodiments, the second semiconductor region 106 has a thickness between 1 nm than 100 nm. In some embodiments, the second semiconductor region 106 has a thickness between 5 nm than 50 nm. In some embodiments, the second semiconductor region 106 has a thickness between 50 nm than 100 nm. In some embodiments, the second semiconductor region 106 has a thickness between 10 nm than 40 nm. In some embodiments, the second semiconductor region 106 has a thickness between 10 nm than 30 nm. In some embodiments, the second semiconductor region 106 has a thickness between 10 nm than 20 nm. In some embodiments, the second semiconductor region 106 has a thickness between 20 nm than 30 nm. In some embodiments, the second semiconductor region 106 has a thickness between 30 nm than 40 nm. In some embodiments, the second semiconductor region 106 has a thickness between 40 nm than 50 nm.

In some embodiments, the first semiconductor region 104 has a thickness less than 1000 nm. In some embodiments, the first semiconductor region 104 has a thickness between 1 nm and 1000 nm. In some embodiments, the first semiconductor region 104 has a thickness between 5 nm and 500 nm. In some embodiments, the first semiconductor region 104 has a thickness between 500 nm and 1000 nm. In some embodiments, the first semiconductor region 104 has a thickness between 10 nm and 500 nm. In some embodiments, the first semiconductor region 104 has a thickness between 10 nm and 400 nm. In some embodiments, the first semiconductor region 104 has a thickness between 10 nm and 300 nm. In some embodiments, the first semiconductor region 104 has a thickness between 10 nm and 200 nm. In some embodiments, the first semiconductor region 104 has a thickness between 20 nm and 400 nm. In some embodiments, the first semiconductor region 104 has a thickness between 20 nm and 300 nm. In some embodiments, the first semiconductor region 104 has a thickness between 20 nm and 200 nm. In some embodiments, the first semiconductor region 104 has a thickness between 20 nm and 400 nm. In some embodiments, the first semiconductor region 104 has a thickness between 20 nm and 300 nm. In some embodiments, the first semiconductor region 104 has a thickness between 20 nm and 200 nm. In some embodiments, the first semiconductor region 104 has a thickness between 20 nm and 100 nm.

Figure 1B:
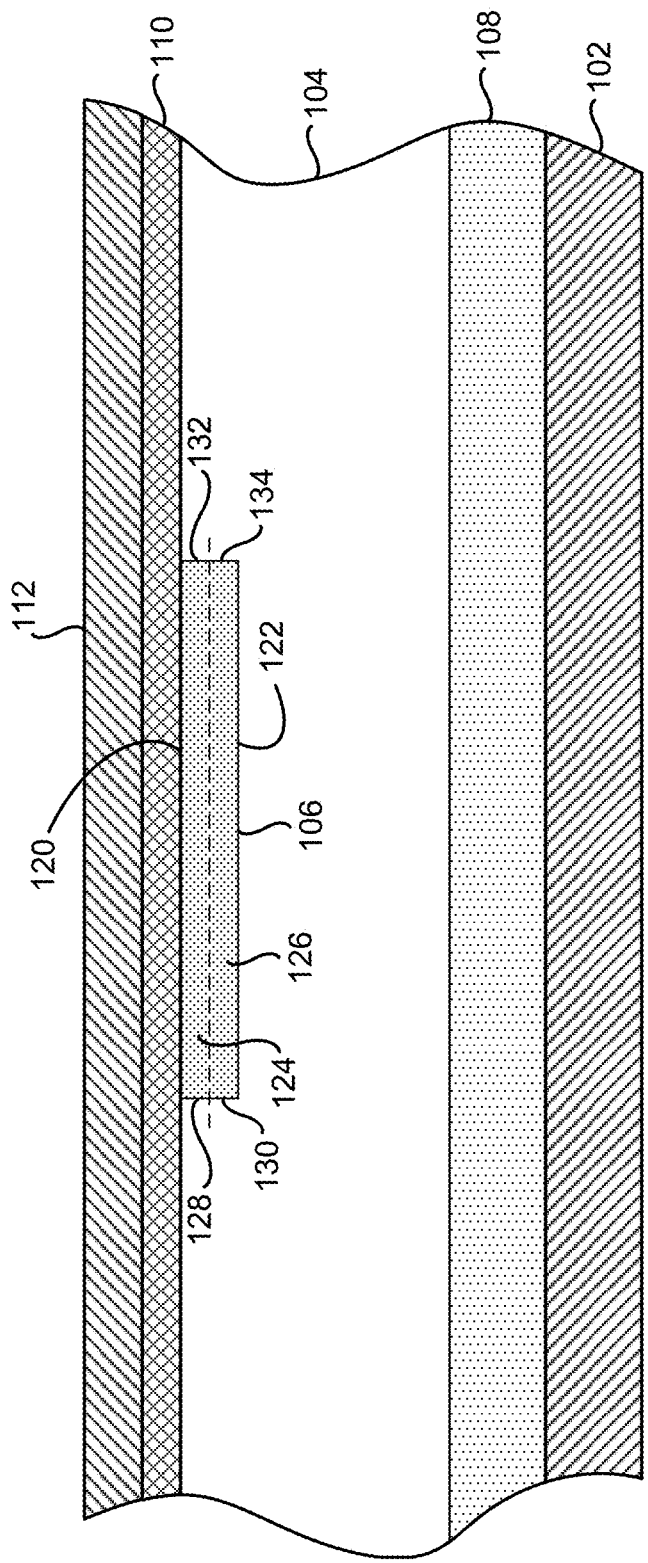
FIG. 1B is a partial cross-sectional view of the semiconductor optical sensor device illustrated in FIG. 1A, in accordance with some embodiments.

FIG. 1A also indicates plane AA upon which the view illustrated in FIG. 1B is taken.

FIG. 1B is a partial cross-sectional view of the semiconductor optical sensor device illustrated in FIG. 1A, in accordance with some embodiments.

In FIG. 1B, the first semiconductor region 104, the second semiconductor region 106, the gate insulation layer 110, the gate 112, the substrate insulation layer or third semiconductor region 108, and the substrate 102 are illustrated. For brevity, the description of these elements are not repeated herein.

As shown in FIG. 1B, the first semiconductor region 104 is in contact with both the upper portion 124 and the lower portion 126 of the second semiconductor region 106. The first semiconductor region 104 is in contact with the upper portion 124 of the second semiconductor region 106 at least at a location positioned under the gate 112. In some embodiments, the first semiconductor region 104 is in contact with the upper portion 124 of the second semiconductor region 106 at least at a location positioned directly under the gate 112. In some embodiments, the first semiconductor region 104 is in contact with the top surface 120 of the second semiconductor region 106 at least on an edge of the top surface 120 of the second semiconductor region 106. In some embodiments, the first semiconductor region 104 is in contact with the top surface 120 of the second semiconductor region 106 at least on an edge of the top surface 120 of the second semiconductor region 106 at a location directly under the gate 112.

In some embodiments, the second semiconductor region 106 has a first lateral surface (e.g., a combination of a lateral surface 128 of the upper portion 124 and a lateral surface 130 of the lower portion 126) that extends from the source 114 (FIG. 1A) to the drain 116 (FIG. 1A) and is distinct from the top surface 120 and the bottom surface 122. The second semiconductor region 106 has a second lateral surface (e.g., a combination of a lateral surface 132 of the upper portion 124 and a lateral surface 134 of the lower portion 126) that extends from the source 114 (FIG. 1A) to the drain 116 (FIG. 1A) and is distinct from the top surface 120 and the bottom surface 122. The first lateral surface and the second lateral surface are located on opposite sides of the second semiconductor region 106. In some embodiments, the first semiconductor region 104 is in contact with the upper portion 124 of the second semiconductor region 106 through a portion 128 of the first lateral surface. In some embodiments, the first semiconductor region 104 is in contact with the upper portion 124 of the second semiconductor region 106 through a portion 132 of the second lateral surface. In some embodiments, the first semiconductor region 104 is in contact with the upper portion 124 of the second semiconductor region 106 through a portion 128 of the first lateral surface at a location directly under the gate 112 and the first semiconductor region 104 is also in contact with the upper portion 124 of the second semiconductor region 106 through a portion 132 of the second lateral surface at a location directly under the gate 112.

In some embodiments, the lateral surface 128 of the upper portion 124 has a thickness less than 1 nm, 2 nm, 3 nm, 4 nm, 5 nm, 6 nm, 7 nm, 8 nm, 9 nm, or 10 nm. In some embodiments, the lateral surface 132 of the upper portion 124 has a thickness less than 1 nm, 2 nm, 3 nm, 4 nm, 5 nm, 6 nm, 7 nm, 8 nm, 9 nm, or 10 nm. In some embodiments, the lateral surface 128 of the upper portion 124 has a thickness less a thickness of the lateral surface 130 of the lower portion 126. In some embodiments, the lateral surface 132 of the upper portion 124 has a thickness less a thickness of the lateral surface 134 of the lower portion 126.

Figure 2A:
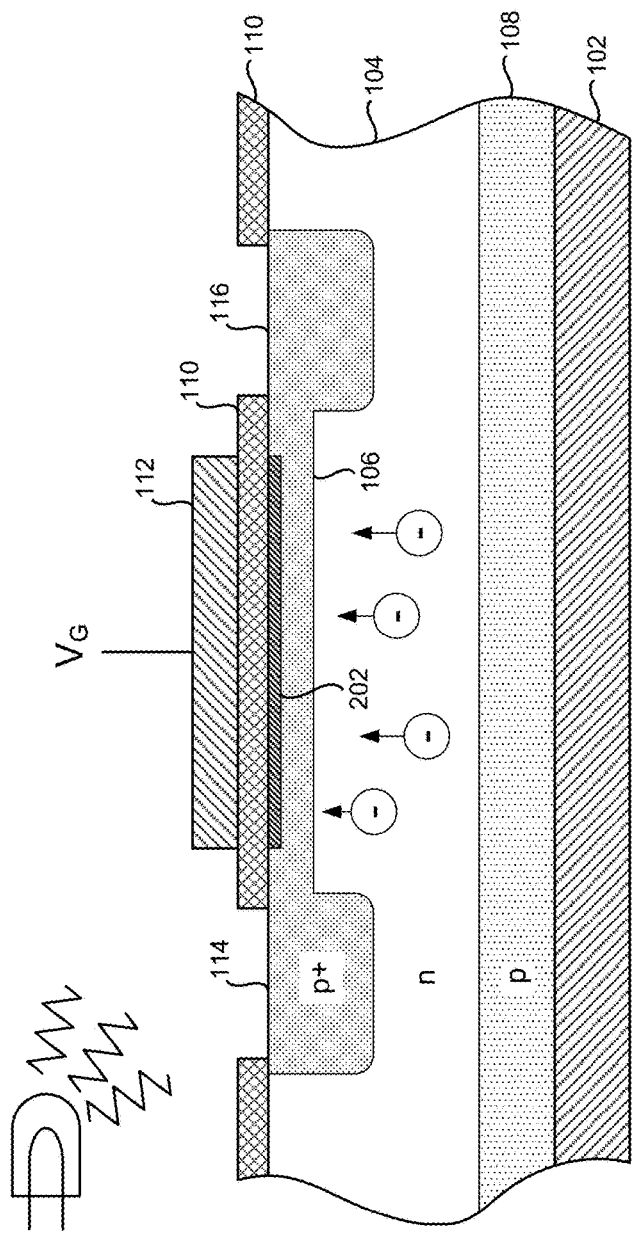
FIG. 2A is a schematic diagram illustrating an operation of a semiconductor optical sensor device in accordance with some embodiments.
Figure 2B:
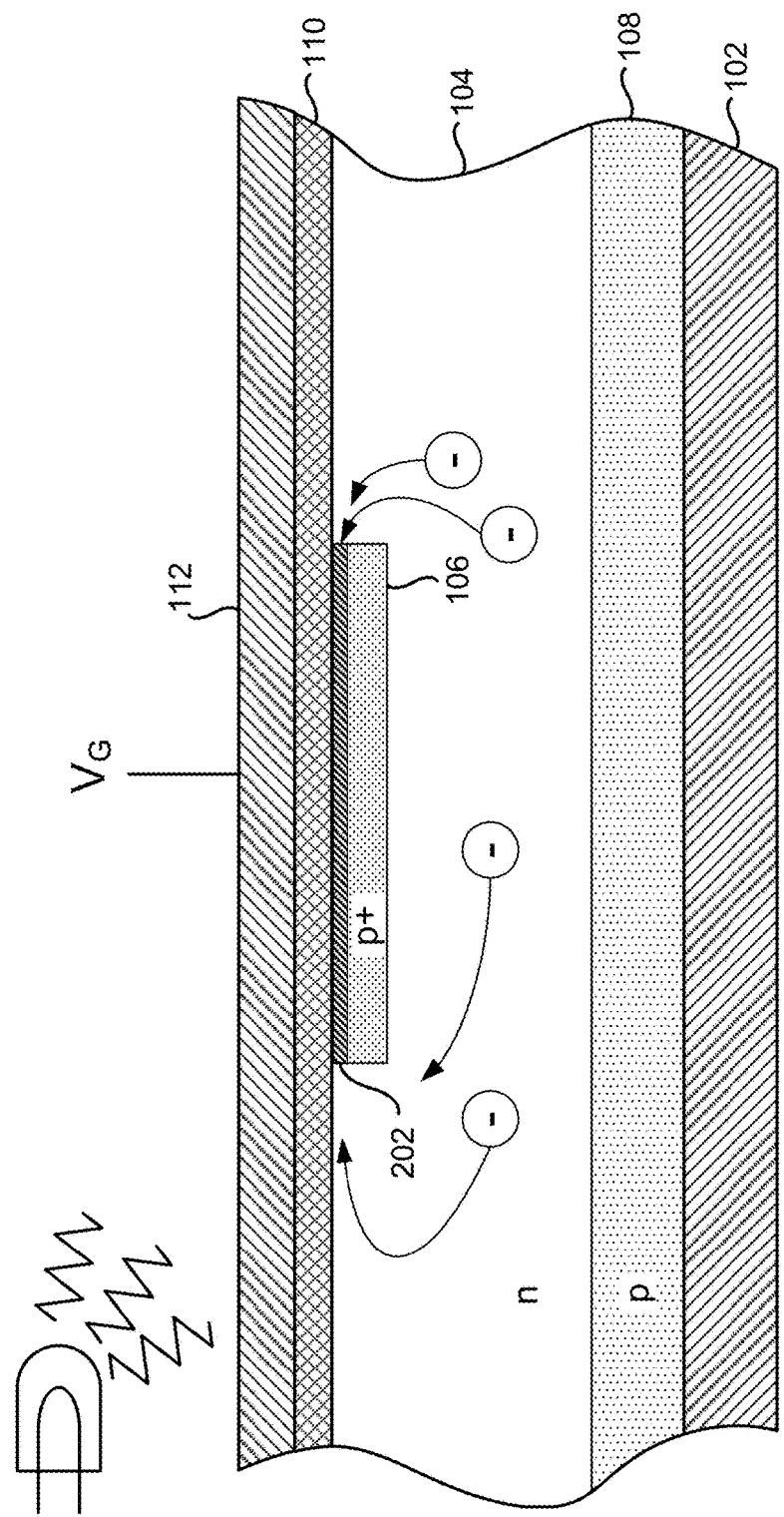
FIG. 2B is a schematic diagram illustrating the operation of the semiconductor optical sensor device illustrated in FIG. 2A, in accordance with some embodiments.

FIGS. 2A-2B are used below to illustrate operational principles of the semiconductor optical sensor device in accordance with some embodiments. However, FIGS. 2A-2B and the described principles are not intended to limit the scope of claims.

FIG. 2A is a schematic diagram illustrating an operation of a semiconductor optical sensor device in accordance with some embodiments.

The device illustrated in FIG. 2A is similar the device illustrated in FIG. 1A. For brevity, the description of the elements described above with respect to FIG. 1A is not repeated herein.

In FIG. 2A, the first semiconductor region 104 is doped with an n-type semiconductor. The second semiconductor region 106 is heavily doped with a p-type semiconductor. The third semiconductor region 108 is doped with a p-type semiconductor. In some embodiments, the third semiconductor region 108 is lightly doped with the p-type semiconductor.

While voltage $V_G$ is applied to the gate 112, a potential well 202 is formed between the second semiconductor region 106 and the gate insulation layer 110. While the device (in particular, the first semiconductor region 104) is exposed to light, photo-generated carriers are generated. While voltage $V_G$ is applied to the gate 112, the photo-generated carriers migrate to the potential well 202.

FIG. 2B is a schematic diagram illustrating the operation of the semiconductor optical sensor device illustrated in FIG. 2A, in accordance with some embodiments.

FIG. 2B is similar to FIG. 2A. For brevity, the description of the same elements described above with respect to FIG. 1B is not repeated herein.

In FIG. 2B, the migration path of the photo-generated carriers to the potential well 202 located between the second semiconductor region 106 and the gate insulation layer 110 is indicated. The photo-generated carriers get into the potential well 202 through lateral surfaces of second semiconductor region 106. In some embodiments, at least a portion of the photo-generated carriers directly pass through a bottom surface of the second semiconductor region 106 to reach the potential well 202. This is possible because the second semiconductor region 106 is thin and the barrier between the second semiconductor region 106 and the potential well 202 is low (e.g., less than band gap of Ge). When the photo-generated carriers migrate through the bottom surface of the second semiconductor region 106, carrier recombination may take place in the second semiconductor region 106.

This direct contact between the first semiconductor region 104 and the potential well 202 significantly increases migration of the photo-generated carriers from the first semiconductor region 104 to the potential well 202. Thus, a thick first semiconductor region 104 may be used for increasing the quantum efficiency, while the photo-generated carriers are effectively transported to the potential well 202 for increasing the on/off signal modulation.

In the absence of an exposure to light, the device would have a certain drain current (called herein $I_{off}$). However, when the device is exposed to light, the photo-generated carriers modulate the drain current (e.g., the drain current increases to $I_{on}$).

Figure 3:
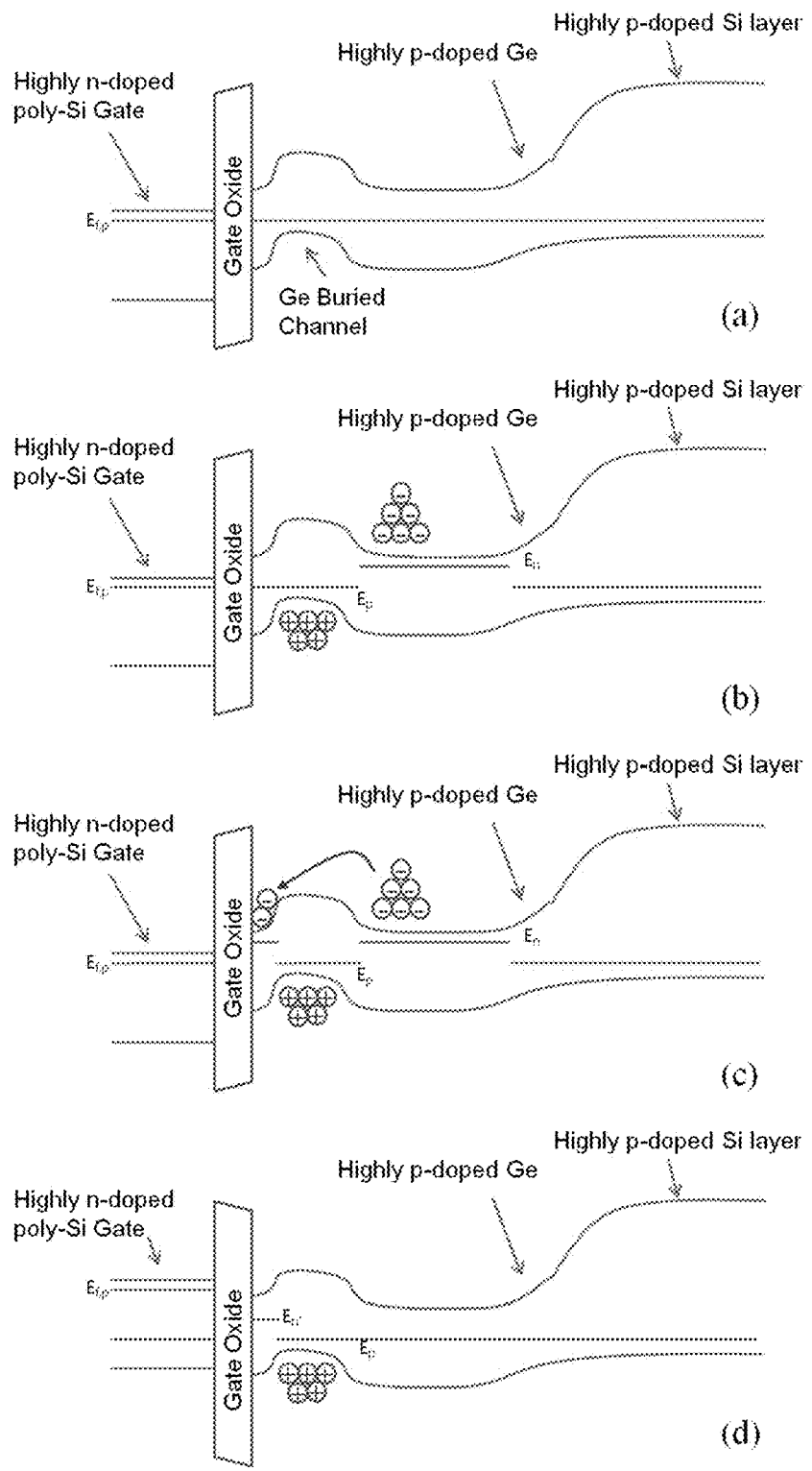
FIG. 3 illustrates exemplary band diagrams in accordance with some embodiments.

FIG. 3 illustrates exemplary band diagrams in accordance with some embodiments. Although FIG. 3 is used to illustrate operational principles of the semiconductor optical sensor device, FIG. 3 and the described principles are not intended to limit the scope of claims.

The band diagrams in FIG. 3 represent electron energy levels from the gate of the semiconductor optical sensor device to the substrate of the semiconductor optical sensor device.

A GCMD can be represented as having a small capacitance and a large capacitance connected around a channel.

The band diagram (a) represents that the device is in the off state.

The band diagram (b) represents that the incident light is absorbed in the substrate region, and carriers are photo-generated in the small capacitance. There is a quasi-Fermi level split in the buried hole channel and substrate.

The band diagram (c) represents that the photo-generated carriers from the low capacitance region are transferred to the large capacitance region (oxide-surface interface) automatically with a proper gate bias. The transferred photo-generated carriers in the oxide-surface interface reduce band bending between the source/drain and the buried hole channel, ultimately increasing the drain current.

The band of the channel with incident light is similar to the band with a lower gate voltage, which is represented in the band diagram (d).

Figure 4A:
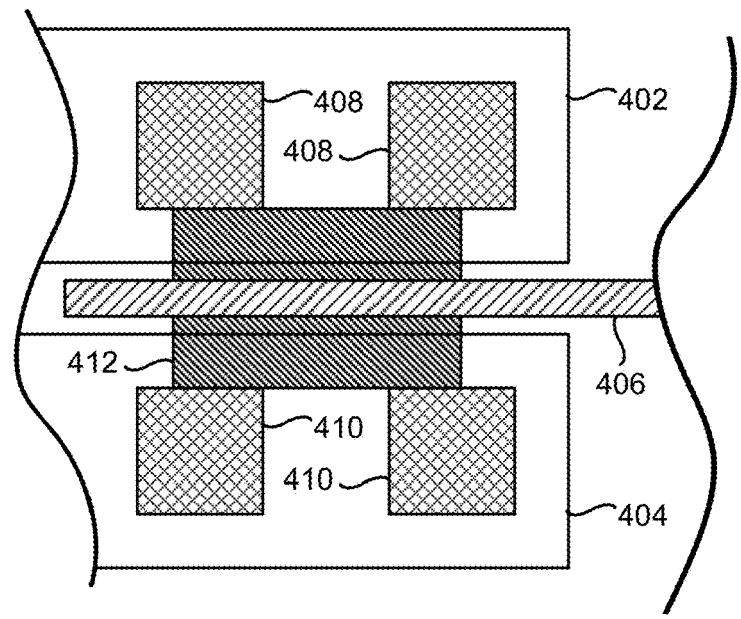
FIG. 4A is a schematic diagram illustrating a single channel configuration of a semiconductor optical sensor device in accordance with some embodiments.
Figure 4B:
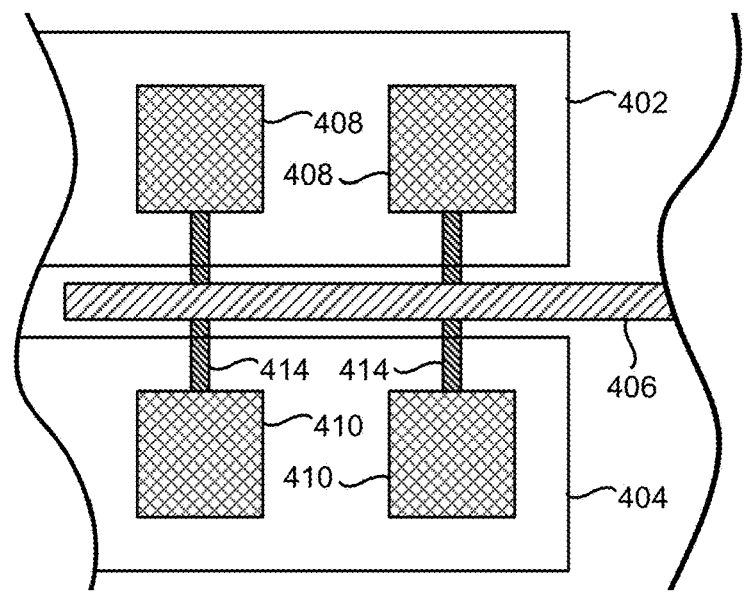
FIG. 4B is a schematic diagram illustrating a multi-channel configuration of a semiconductor optical sensor device in accordance with some embodiments.

FIGS. 4A and 4B are schematic diagrams illustrating a single channel configuration and a multi-channel configuration of a semiconductor optical sensor device. The schematic diagrams in FIGS. 4A and 4B are based on top-down views of the semiconductor optical sensor device. However, it should be noted that the schematic diagrams in FIGS. 4A and 4B are used to represent relative sizes and positions of various elements and that the schematic diagrams in FIGS. 4A and 4B are not cross-sectional views.

FIG. 4A is a schematic diagram illustrating a single channel configuration of a semiconductor optical sensor device in accordance with some embodiments.

FIG. 4A illustrates that the device has a gate 406, a source 402, and a drain 404. The device also includes a channel 412 that extends from the source 402 to the drain 404. The channel 412 is typically defined by the second semiconductor region. For example, the shape of the channel 412 is determined by a pattern of ion implantation in forming the second semiconductor region. The source 402 has multiple contacts 408 with the channel 412 and the drain 404 has multiple contacts 408 with the channel 412.

FIG. 4B is a schematic diagram illustrating a multi-channel configuration of a semiconductor optical sensor device in accordance with some embodiments.

FIG. 4B is similar to FIG. 4A except that the device has multiple channels 414 between the source 402 and the drain 404. In some embodiments, the second semiconductor region defines multiple channels 414 between the source 402 and the drain 404. Each channel 414 in FIG. 4B connects a single contact 408 of the source 402 and a single contact 410 of the drain 404. Thus, a width of the channel 414 in FIG. 4B is less than a width of the channel 412 in FIG. 4A. The reduced width of a channel is believed to facilitate a transfer of a photo-generated carrier to a large capacitance region (e.g., an interface of the second semiconductor region and the gate insulation layer) of the device.

Figure 5:
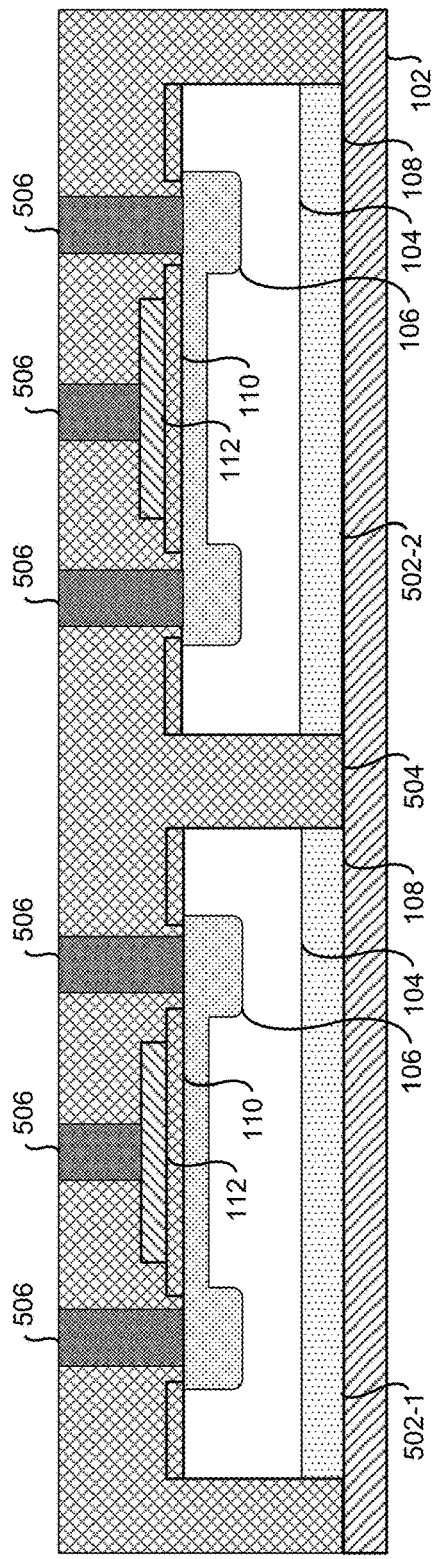
FIG. 5 is a partial cross-sectional view of semiconductor optical sensor devices in accordance with some embodiments.

FIG. 5 is a partial cross-sectional view of semiconductor optical sensor devices in accordance with some embodiments.

FIG. 5 illustrates that a plurality of semiconductor optical sensor devices (e.g., devices 502-1 and 502-2) are formed on a common substrate. The multiple devices form a sensor array. Although FIG. 5 illustrates two semiconductor optical sensor devices, the sensor array may include more than two semiconductor optical sensor devices. In some embodiments, the sensor array includes a two-dimensional array of semiconductor optical sensor devices.

FIG. 5 also illustrates that vias 506 are formed to connect the gate 112, the source, and the drain of the devices 502-1 and 502-2.

In some embodiments, the plurality of devices (e.g., devices 502-1 and 502-2) has the first semiconductor region 104 on a common plane. In some embodiments, the first semiconductor region 104 of the plurality of devices is formed concurrently (e.g., using epitaxial growth of the first semiconductor region 104).

In some embodiments, the plurality of devices (e.g., devices 502-1 and 502-2) has the second semiconductor region 106 on a common plane. In some embodiments, the second semiconductor region 106 of the plurality of devices is formed concurrently (e.g., using ion implantation).

In some embodiments, the plurality of devices (e.g., devices 502-1 and 502-2) has the third semiconductor region 108 on a common plane. In some embodiments, the third semiconductor region 108 of the plurality of devices is formed concurrently (e.g., using epitaxial growth of germanium islands).

In some embodiments, the plurality of devices is separated by one or more trenches. For example, the device 502-1 and the device 502-2 are separate by a trench. In some embodiments, the one or more trenches are filled with an insulator. In some embodiments, a trench is a shallow trench isolator.

In some embodiments, the plurality of devices is positioned on separate germanium islands formed on the common silicon substrate 102. For example, in some embodiments, third semiconductor regions 108 (e.g., germanium islands) are formed on the substrate 102 and the rest of devices 502-1 and 502-2 are formed over the third semiconductor regions 108.

In some embodiments, the sensor array includes a passivation layer over the plurality of devices. For example, the passivation layer 504 is positioned over the devices 502-1 and 502-2 in FIG. 5.

In some embodiments, the sensor array includes a passivation layer between the plurality of devices. For example, the passivation layer 504 is positioned between the devices 502-1 and 502-2 in FIG. 5.

FIG. 6 illustrates an exemplary sensor circuit in accordance with some embodiments.

The sensor circuit includes a photo-sensing element 602. The photo-sensing element 602 has a source terminal, a gate terminal, a drain terminal, and body terminal 605. The sensor circuit also includes a selection transistor 604 having a source terminal, a gate terminal, and a drain terminal. In some embodiments, the drain terminal of the selection transistor 604 is electrically coupled (e.g., at a point 606) with the source terminal of the photo-sensing element 602. In some embodiments, the source terminal of the selection transistor 604 is electrically coupled (e.g., at the point 606) with the drain terminal of the photo-sensing element 602.

In some embodiments, the photo-sensing element is a GCMD (e.g., the device 100, FIG. 1A).

In some embodiments, the source terminal or the drain terminal, of the photo-sensing element 602, that is not electrically coupled with the source terminal or the drain terminal of the selection transistor 604 is connected to a ground. For example, $V_2$ is connected to a ground.

In some embodiments, the source terminal or the drain terminal, of the photo-sensing element 602, that is electrically coupled with the source terminal or the drain terminal of the selection transistor 604 is not connected to a ground. For example, the point 606 is not connected to a ground.

In some embodiments, the source terminal or the drain terminal, of the photo-sensing element 602, that is electrically coupled with the source terminal or the drain terminal of the selection transistor 604 is electrically coupled with a first voltage source. For example, $V_2$ is connected to the first voltage source.

In some embodiments, the first voltage source provides a first fixed voltage, such as a voltage that is distinct from the ground.

In some embodiments, the source terminal or the drain terminal, of the selection transistor 604, that is not electrically coupled with the source terminal or the drain terminal of the photo-sensing element 620 is electrically coupled with a second voltage source. For example, $V_1$ is connected to the second voltage source. In some embodiments, the second voltage source provides a second fixed voltage.

In some embodiments, the sensor circuit includes no more than two transistors, the two transistors including the selection transistor 604. In some embodiments, the sensor circuit also includes a gate control transistor that is electrically coupled to the gate of the photo-sensing element.

In some embodiments, the sensor circuit includes no more than one transistor, the one transistor being the selection transistor 604.

The sensor circuit in FIG. 6 is called herein one-transistor modified active-pixel sensor (1T-MAPS), because the sensor circuit includes a single transistor and a modified active-pixel sensor. The difference between 1T-MAPS and a conventional sensor circuit called three-transistor active-pixel sensor (3T-APS) is described below with respect to FIGS. 7A-7B.

FIG. 7A illustrates an exemplary 3T-APS circuit in accordance with some embodiments.

The 3T-APS circuit includes a photo-sensing element (e.g., a photodiode) and three transistors: a reset transistor Mrst, a source-follower transistor Msf, and a select transistor Msel.

The reset transistor Mrst works as a reset switch. For example, Mrst receives a gate signal RST, which allows a reset voltage, Vrst, to be provided to the photo-sensing element to reset the photo-sensing element.

The source-follower transistor Msf acts as a buffer. For example, Msf receives an input (e.g., a voltage input) from the photo-sensing element, which allows a high voltage Vdd to be output to the source of the select transistor Msel.

The select transistor Msel works as a readout switch. For example, Msel receives a row selection signal ROW, which allows an output from the source-follower transistor Msf to be provided to a column line.

FIG. 7B illustrates an exemplary 1T-MAPS circuit in accordance with some embodiments.

As explained above with respect to FIG. 6, the 1T-MAPS circuit includes one photo-sensing element (e.g., GCMD) and one transistor, namely a select transistor Msel.

The select transistor Msel receives a row selection signal ROW, which allows a current from the column line to flow to an input of the photo-sensing element. Alternatively, the row selection signal ROW, provided to the select transistor Msel, allows a current from the photo-sensing element to flow to the column line. In some embodiments, the column line is set to a fixed voltage.

In some embodiments, the 1T-MAPS circuit does not require a reset switch, because photo-generated carriers stored in the GCMD dissipate in a short period of time (e.g., 0.1 second).

A comparison of the 3T-APS circuit illustrated in FIG. 7A and the 1T-MAPS circuit illustrated in FIG. 7B shows that the 1T-MAPS circuit has a much smaller size than the 3T-APS circuit. Thus, a 1T-MAPS circuit is more cost advantageous than a 3T-APS circuit made of a same material. In addition, due to the smaller size, more 1T-MAPS circuits can be placed on a same area of a die than 3T-APS circuits, thereby increasing a number of pixels on the die.

FIGS. 8A-8H illustrate exemplary sensor circuits in accordance with some embodiments. In FIGS. 8A-8H, a switch symbol represents a select transistor.

FIGS. 8A-8D illustrate exemplary sensor circuits that include a PMOS-type GCMD.

Figure 8A:
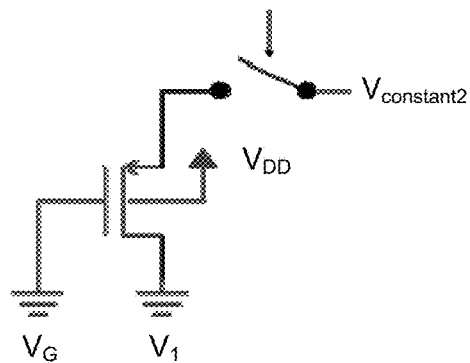
FIGS. 8A-8H illustrate exemplary sensor circuits in accordance with some embodiments.

In FIG. 8A, the gate of the GCMD is connected to a ground $V_G$, and the drain of the GCMD is connected to a low voltage source $V_1$ (e.g., ground). The source of the GCMD is connected to a switch (or a select transistor), which is connected to a fixed voltage, $V_{constant2}$. In some embodiments, the body is connected to a high voltage source $V_{DD}$.

Figure 8B:
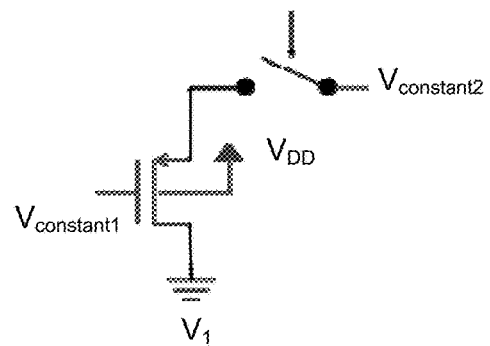

In FIG. 8B, the gate of the GCMD is connected to a fixed voltage $V_{constant1}$, and the drain of the GCMD is connected to a low voltage source $V_1$ (e.g., ground). The source of the GCMD is connected to a switch (or a select transistor), which is connected to a fixed voltage, $V_{constant2}$. In some embodiments, the body is connected to a high voltage source $V_{DD}$.

Figure 8C:
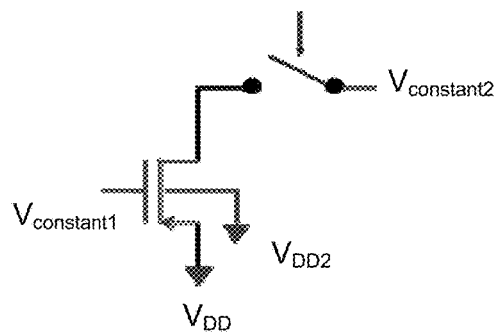

In FIG. 8C, the gate of the GCMD is connected to a fixed voltage $V_{constant1}$, and the source of the GCMD is connected to a high voltage source $V_{DD}$. The drain of the GCMD is connected to a switch (or a select transistor), which is connected to a fixed voltage, $V_{constant2}$. In some embodiments, the body is connected to a high voltage source $V_{DD2}$.

Figure 8D:
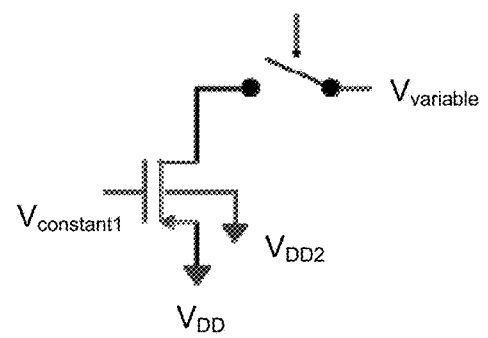

In FIG. 8D, the gate of the GCMD is connected to a fixed voltage $V_{constant1}$, and the source of the GCMD is connected to a high voltage source $V_{DD}$. The drain of the GCMD is connected to a switch (or a select transistor), which is connected to a variable voltage, $V_{variable}$. In some embodiments, the body is connected to a high voltage source $V_{DD2}$.

FIGS. 8E-8H illustrate exemplary sensor circuits that include NMOS type GCMD.

Figures 8E, 8F:
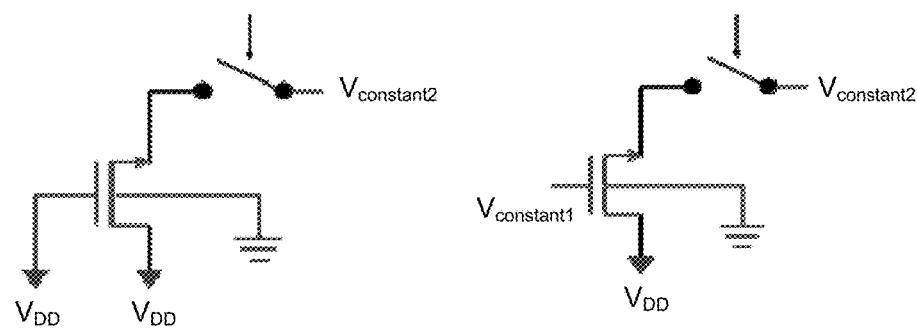

In FIG. 8E, the gate and the drain of the GCMD are connected to a high voltage source $V_{DD}$. The source of the GCMD is connected to a switch (or a select transistor), which is connected to a fixed voltage, $V_{constant2}$. In some embodiments, the body is connected to a ground.

In FIG. 8F, the gate of the GCMD is connected to a fixed voltage $V_{constant1}$, and the drain of the GCMD is connected to a high voltage source $V_{DD}$. The source of the GCMD is connected to a switch (or a select transistor), which is connected to a fixed voltage, $V_{constant2}$. In some embodiments, the body is connected to a ground.

Figures 8G, 8H:
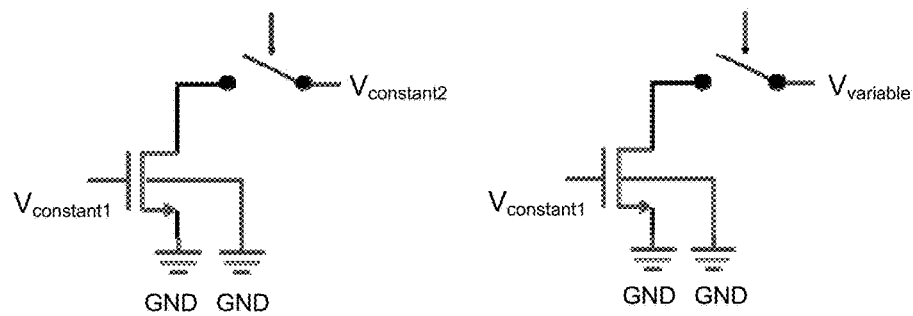

In FIG. 8G, the gate of the GCMD is connected to a fixed voltage $V_{constant1}$, and the source of the GCMD is connected to a ground. The drain of the GCMD is connected to a switch (or a select transistor), which is connected to a fixed voltage, $V_{constant2}$. In some embodiments, the body is connected to a ground.

In FIG. 8H, the gate of the GCMD is connected to a fixed voltage $V_{constant1}$, and the source of the GCMD is connected to a ground. The drain of the GCMD is connected to a switch (or a select transistor), which is connected to a variable voltage, $V_{variable}$. In some embodiments, the body is connected to a ground.

In FIGS. 8A-8H, the drain current in the GCMD changes depending on whether the GCMD is exposed to light. Thus, in some embodiments, the GCMD is modeled as a current source that provides $I_{on}$ when the GCMD is exposed to light and provide $I_{off}$ when the GCMD is not exposed to light.

Figure 9A:
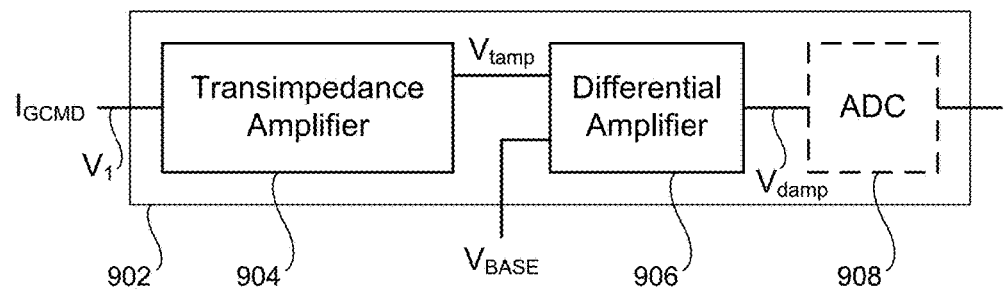
FIGS. 9A-9C illustrate exemplary converter circuits in accordance with some embodiments.
Figure 9B:
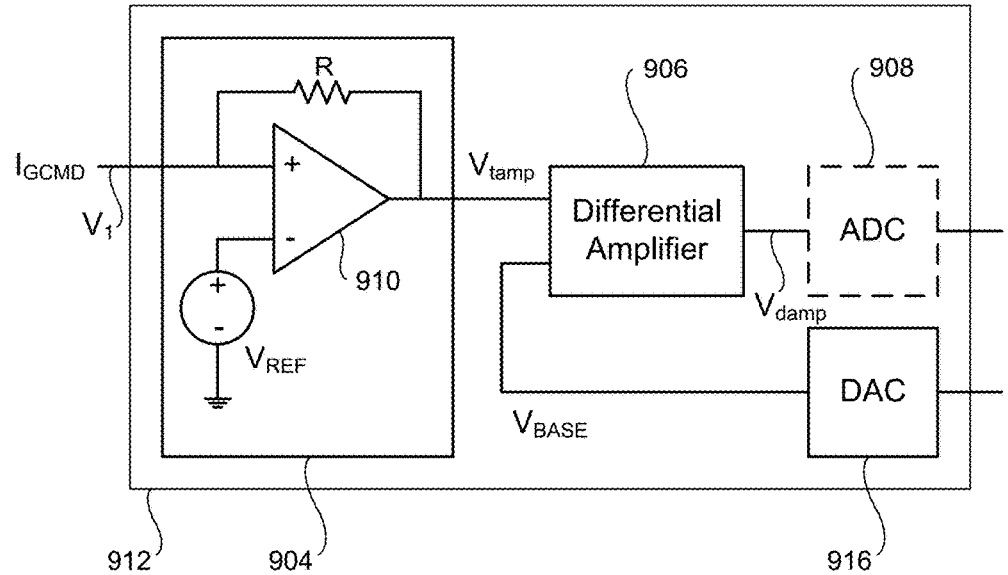
Figure 9C:
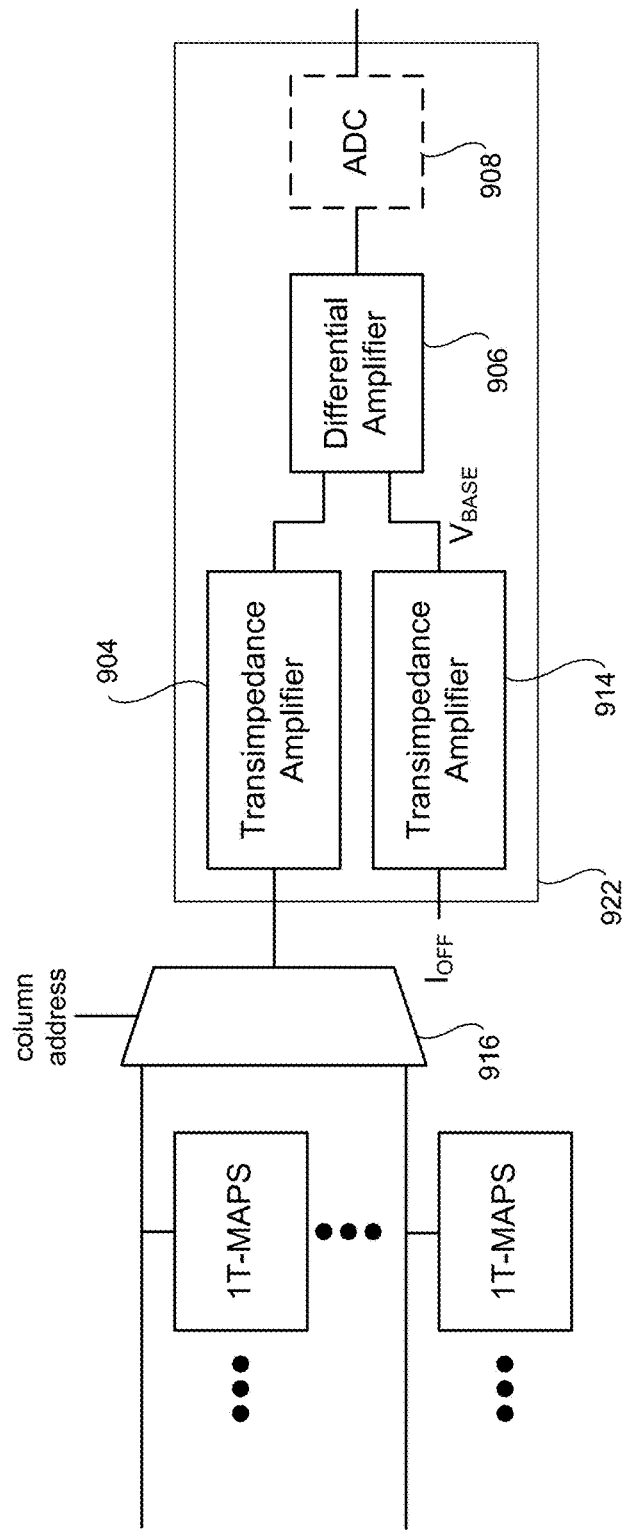

FIGS. 9A-9C illustrate exemplary converter circuits in accordance with some embodiments.

FIG. 9A illustrates an exemplary converter circuit 902 in accordance with some embodiments.

The converter circuit 902 includes a first transimpedance amplifier 904 (e.g., an operational amplifier) that has an input terminal (e.g., an input terminal receiving $I_{GCMD}$ from the photo-sensing element, such as the GCMD) electrically coupled with the source terminal or the drain terminal of the selection transistor of a first sensor circuit (e.g., the sensor circuit in FIG. 6), that is not electrically coupled with the source terminal or the drain terminal of the photo-sensing element (e.g., the terminal having a voltage $V_1$ in FIG. 6). The first transimpedance amplifier 904 is configured to convert a current input (e.g., $I_{GCMD}$) from the photo-sensing element into a voltage output (e.g., $V_{tamp}$).

The converter circuit 902 also includes a differential amplifier 906 having two input terminals. A first input terminal of the two input terminals is electrically coupled with the voltage output (e.g., $V_{tamp}$) of the first transimpedance amplifier 904 and a second input terminal of the two input terminals is electrically coupled with a voltage source that is configured to provide a voltage (e.g., $V_{BASE}$) corresponding to a base current provided by the photo-sensing element. The differential amplifier is configured to output a voltage (e.g., $V_{damp}$) based on a voltage difference between the voltage output (e.g., $V_{tamp}$) and the voltage provided by the voltage source (e.g., $V_{BASE}$). In some embodiments, the differential amplifier 906 includes an operational amplifier. In some embodiments, the differential amplifier 906 includes a transistor long tailed pair.

In some embodiments, the converter circuit 922 includes an analog-to-digital converter 908 electrically coupled to an output of the differential amplifier 906 (e.g., $V_{tamp}$), the analog-to-digital converter configured to convert the output (e.g., a voltage output) of the differential amplifier 906 (e.g., $V_{tamp}$) into a digital signal.

FIG. 9B illustrates an exemplary converter circuit 912 in accordance with some embodiments. The converter circuit 912 is similar to the converter circuit 902 illustrated in FIG. 9A. Some of the features described with respect to FIG. 9A are applicable to the converter circuit 912. For brevity, the description of such features is not repeated herein.

FIG. 9B illustrates that, in some embodiments, the first transimpedance amplifier 904 in the converter circuit 912 includes an operational amplifier 910. The operational amplifier 910 has a non-inverting input terminal that is electrically coupled with the source terminal or the drain terminal of the selection transistor of the first sensor circuit (E.g., the terminal having a voltage $V_1$ in FIG. 6). The operational amplifier 910 also has an inverting input terminal that is electrically coupled with a reference voltage source that provides a reference voltage $V_{REF}$. The operational amplifier 910 has an output terminal, and a resistor with a resistance value R is electrically coupled to the non-inverting input terminal on a first end of the resistor and to the output terminal on the second end, opposite to the first end, of the resistor.

In operation, the voltage output $V_{tamp}$ is determined as follows:

$$V_{tamp} = V_{REF} + R \cdot I_{GCMD}$$

Furthermore, the current from the GCMD can be modeled as follows:

$$I_{GCMD} = I_{off} \text{ (no light)}$$

$$I_{GCMD} = I_\Delta + I_{off} \text{ (light)}$$

In some embodiments, the base current corresponds to a current provided by the photo-sensing element while the photo-sensing element receives substantially no light (e.g., $I_{off}$). When $I_{off}$ is converted by the first transimpedance amplifier 904, a corresponding voltage $V_{BASE}$ is determined as follows:

$$V_{BASE} = V_{REF} + R \cdot I_{off}$$

Then, the voltage difference between $V_{tamp}$ and $V_{BASE}$ is as follows:

$$V_{tamp} - V_{BASE} = R \cdot I_\Delta$$

The voltage output $V_{damp}$ of the differential amplifier 906 is as follows:

$$V\text{damp} = A \cdot R \cdot I_{66}$$

where A is a differential gain of the differential amplifier 906. In some embodiments, the differential gain is one of: one, two, three, five, ten, twenty, fifty, and one hundred.

FIG. 9B also illustrates that, in some embodiments, the voltage source is a digital-to-analog converter (DAC) 916. For example, the DAC 916 is configured to provide $V_{BASE}$.

FIG. 9C illustrates an exemplary converter circuit 922 in accordance with some embodiments. The converter circuit 922 is similar to the converter circuit 902 illustrated in FIG. 9A and the converter circuit 912 illustrated in FIG. 9B. Some of the features described with respect to FIGS. 9A and 9B are applicable to the converter circuit 922. For example, in some embodiments, the converter circuit 922 includes the digital-to-analog converter 916. In some embodiments, the first transimpedance amplifier 904 includes an operational amplifier 910. For brevity, the description of such features is not repeated herein.

FIG. 9C illustrates that the voltage source (that provides $V_{BASE}$) is a second transimpedance amplifier 914 having an input terminal electrically coupled with a second sensor circuit that is distinct from the first sensor circuit. In some embodiments, the input terminal of the second transimpedance amplifier 914 is electrically coupled with the source terminal or the drain terminal of the selection transistor of the second sensor circuit. In some embodiments, the photo-sensing element of the second sensor circuit is optically covered so that the photo-sensing element of the second sensor circuit is prevented from receiving light. Thus, the second sensor circuit provides $I_{off}$ to the second transimpedance amplifier 914. The second transimpedance amplifier 914 converts $I_{off}$ to $V_{BASE}$. In some embodiments, the second transimpedance amplifier 914 includes an operational amplifier.

In some embodiments, the first transimpedance amplifier 904 is configured to electrically couple with a respective sensor circuit of a plurality of sensor circuits through a multiplexer. For example, the converter circuit 922 is coupled to a multiplexer 916. The multiplexer receives a column address to select one of a plurality of column lines. Each column line is connected to multiple sensor circuits, each having a selection transistor that receives a ROW signal. Thus, based on a column address and a ROW signal, one sensor circuit in a two-dimensional array of sensor circuits is selected, and a current output from the selected sensor circuit is provided to the first transimpedance amplifier 904 through the multiplexer 916.

Although FIGS. 9A-9C illustrate selected embodiments, it should be noted that a converter circuit may include a subset of the features described in FIGS. 9A-9C (e.g., the converter circuit 922 may be coupled with the multiplexer 916 without having the second transimpedance amplifier 914). In some embodiments, a converter circuit includes additional features not described with respect to FIGS. 9A-9C.

Figure 10:
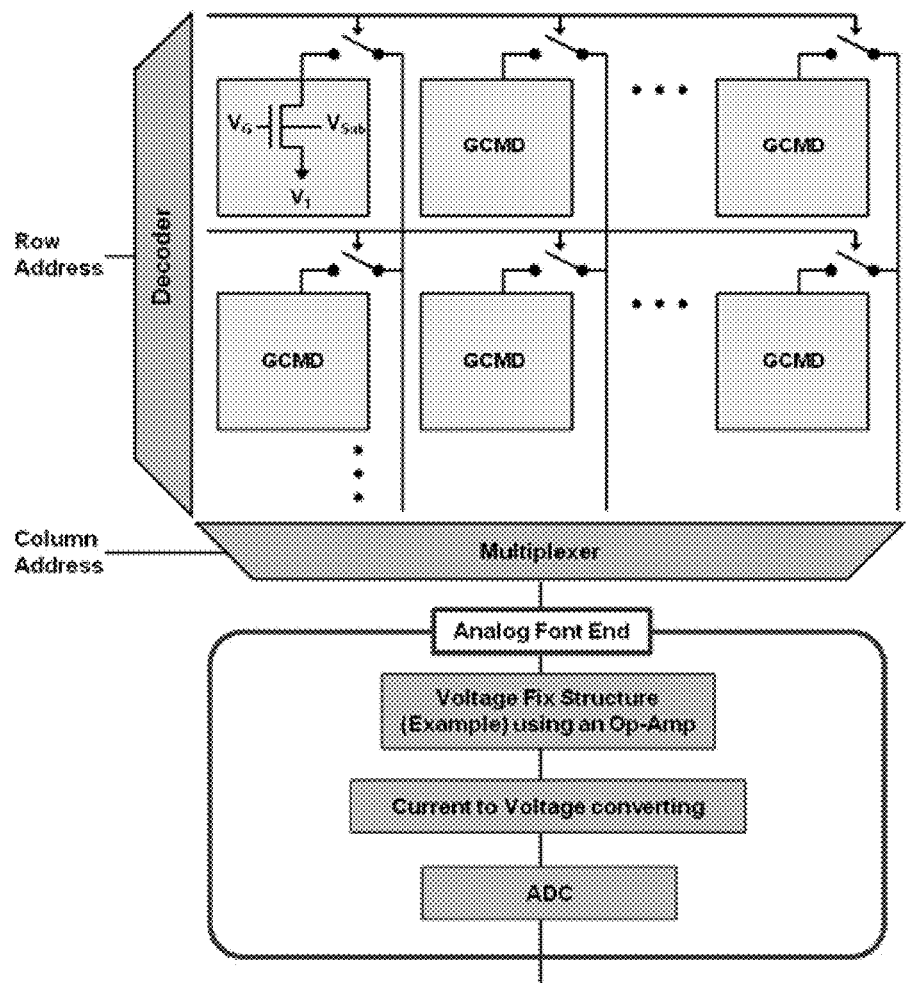
FIG. 10 illustrates an exemplary image sensor device in accordance with some embodiments.

FIG. 10 illustrates an exemplary image sensor device in accordance with some embodiments.

In accordance with some embodiments, the image sensor device includes an array of sensors. A respective sensor in the array of sensors includes a sensor circuit (e.g., FIGS. 8A-8H).

In some embodiments, the image sensor device includes a converter circuit (e.g., FIGS. 9A-9C).

In some embodiments, the array of sensors includes multiple rows of sensors (e.g., at least two rows of sensors are illustrated in FIG. 10). For sensors in a respective row, gate terminals of selection transistors are electrically coupled to a common selection line. For example, as shown in FIG. 10, gate terminals of sensor circuits in a top row are electrically coupled to a same signal line.

In some embodiments, the array of sensors includes multiple columns of sensors (e.g., at least three columns of sensors are illustrated in FIG. 10). For sensors in a respective column, one of source terminals or drain terminals of selection transistors (i.e., either the source terminals of the selection transistors or the drain terminals of the selection transistors) are electrically coupled to a common column line. For example, as shown in FIG. 10, the drain terminals of the selection transistors in a left column of sensors are electrically coupled to a same column line.

FIGS. 11A-11E illustrates an exemplary method for making a semiconductor optical sensor device in accordance with some embodiments.

Figure 11A:
FIGS. 11A-11E illustrates an exemplary method for making a semiconductor optical sensor device in accordance with some embodiments.

FIG. 11A illustrates forming the semiconductor optical sensor device includes forming a third semiconductor region 108 on a silicon substrate 102. In some embodiments, the third semiconductor region 108 is epitaxially grown on the substrate 102.

Figure 11B:
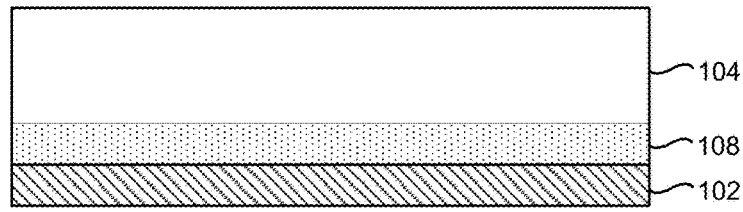

FIG. 11B illustrates forming a first semiconductor region 104, above the silicon substrate 102, doped with a dopant of a first type.

In some embodiments, the first semiconductor region 104 is formed by epitaxially growing the first semiconductor region 104.

In some embodiments, the first semiconductor region 104 is doped in-situ with the dopant of the first type (e.g., n-type) while the first semiconductor region 104 is grown.

In some embodiments, the first semiconductor region 104 is doped with the dopant of the first type (e.g., n-type) using an ion implantation process or a gas phase diffusion process. In some embodiments, the first semiconductor region 104 is doped with the dopant of the first type (e.g., n-type) using an ion implantation process. In some embodiments, the first semiconductor region 104 is doped with the dopant of the first type (e.g., n-type) using a gas phase diffusion process.

Figure 11C:
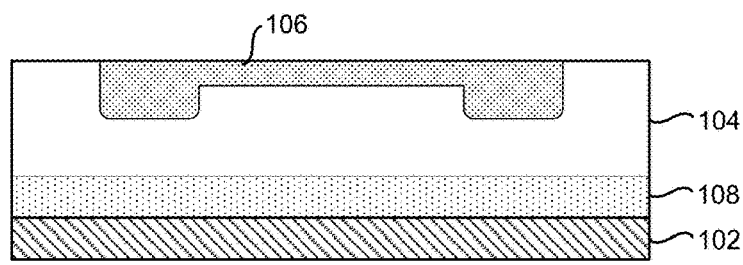

FIG. 11C illustrates forming a second semiconductor region 106, above the silicon substrate 102, doped with a dopant of a second type. The second semiconductor region 106 is positioned above the first semiconductor region 104. The first type (e.g., n-type) is distinct from the second type (e.g., p-type).

In some embodiments, the second semiconductor region 106 is formed by epitaxially growing the second semiconductor region 106.

In some embodiments, the second semiconductor region 106 is doped in-situ with the dopant of the second type (e.g., p-type, and in particular, p+) while the second semiconductor region 106 is grown.

In some embodiments, the second semiconductor region 106 is doped with the dopant of the second type (e.g., p-type, and in particular, p+) using an ion implantation process or a gas phase diffusion process. In some embodiments, the second semiconductor region 106 is doped with the dopant of the second type (e.g., p-type, and in particular, p+) using an ion implantation process. In some embodiments, the second semiconductor region 106 is doped with the dopant of the second type (e.g., p-type, and in particular, p+) using a gas phase diffusion process.

In some embodiments, the second semiconductor region 106 is doped with the dopant of the second type (e.g., p-type, and in particular, p+) using an ion implantation process after the first semiconductor region 104 is doped with the dopant of the first type using an ion implantation process or a gas phase diffusion process. In some embodiments, the second semiconductor region 106 is doped with the dopant of the second type (e.g., p-type, and in particular, p+) using an ion implantation process after the first semiconductor region 104 is doped with the dopant of the first type using an ion implantation process. In some embodiments, the second semiconductor region 106 is doped with the dopant of the second type (e.g., p-type, and in particular, p+) using an ion implantation process after the first semiconductor region 104 is doped with the dopant of the first type using a gas phase diffusion process.

Figure 11D:
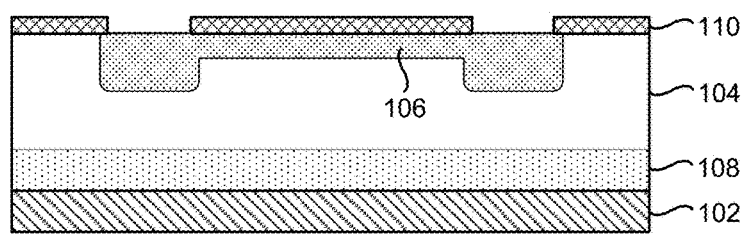

FIG. 11D illustrates forming a gate insulation layer 110 above the second semiconductor region 106. One or more portions of the second semiconductor region 106 are exposed from the gate insulation layer 110 to define a source and a drain. For example, the gate insulation layer 110 is pattern etched (e.g., using a mask) to expose the source and the drain.

As described with respect to FIGS. 1A and 1B, the second semiconductor region 106 has a top surface that faces the gate insulation layer 110. The second semiconductor region 106 has a bottom surface that is opposite to the top surface of the second semiconductor region 106. The second semiconductor region 106 has an upper portion that includes the top surface of the second semiconductor region 106. The second semiconductor region 106 has a lower portion that includes the bottom surface of the second semiconductor region 106 and is mutually exclusive with the upper portion. The first semiconductor region 104 is in contact with both the upper portion and the lower portion of the second semiconductor region 106. The first semiconductor region 104 is in contact with the upper portion of the second semiconductor region 106 at least at a location positioned under the gate 112.

Figure 11E:
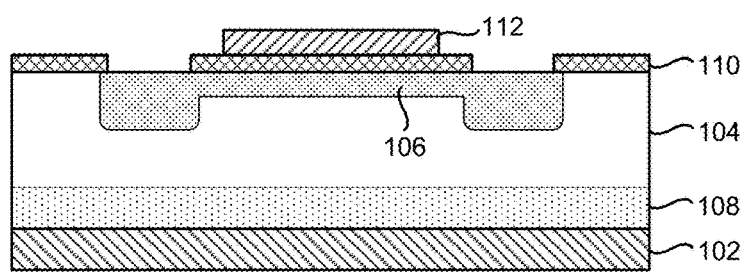

FIG. 11E illustrates forming a gate 112 positioned above the gate insulation layer 110.

In some embodiments, a method of forming a sensor array includes concurrently forming a plurality of devices on a common silicon substrate. For example, third semiconductor regions of multiple devices may be formed concurrently in a single epitaxial growth process. Subsequently, first semiconductor regions of the multiple devices may be formed concurrently in a single epitaxial growth process. Thereafter, second semiconductor regions of the multiple devices may be formed concurrently in a single ion implantation process. Similarly, gate insulation layers of the multiple devices may be formed concurrently, and gates of the multiple devices may be formed concurrently.

In accordance with some embodiments, a method for sensing light includes exposing a photo-sensing element (e.g., GCMD in FIG. 6) to the light.

The method also includes providing a fixed voltage to the source terminal of the photo-sensing element (e.g., by applying a fixed voltage $V_1$ and applying $V_R$ to the selection transistor 604 (FIG. 6). Based on an intensity of light on the GCMD, a drain current of the GCMD changes.

In some embodiments, the method includes determining an intensity of the light based on the drain current of the photo-sensing element (e.g., GCMD). A change in the drain current indicates whether light is detected by the photo-sensing element.

In some embodiments, measuring the drain current includes converting the drain current to a voltage signal (e.g., converting the drain current $I_{GCMD}$ to $V_{tamp}$, FIG. 9A).

In some embodiments, converting the drain current to the voltage signal includes using a transimpedance amplifier (e.g., transimpedance amplifier 904, FIG. 9A) to convert the drain current to the voltage signal.

In some embodiments, measuring the drain current includes using any converter circuit described herein (e.g., FIGS. 9A-9C).

In some embodiments, the method includes activating the selection transistor of the sensor circuit (e.g., the selection transistor 604, FIG. 6). Activating the selection transistor allows a drain current to flow through the selection transistor, thereby allowing a measurement of the drain current.

In some embodiments, the fixed voltage is provided to the source terminal of the photo-sensing element prior to exposing the photo-sensing element to light. For example, in FIG. 6, the selection transistor 604 is activated before exposing the photo-sensing element 602 to light.

In some embodiments, the fixed voltage is provided to the source terminal of the photo-sensing element subsequent to exposing the photo-sensing element to light. For example, in FIG. 6, the selection transistor 604 is activated after exposing the photo-sensing element 602 to light.

In accordance with some embodiments, a method for detecting an optical image includes exposing any array of sensors described herein (e.g., FIG. 10) to a pattern of light.

The method also includes, for a photo-sensing element of a respective sensor in the array of sensors, providing a respective voltage to the source terminal of the photo-sensing element of the respective image sensor. For example, a selection transistor (e.g., the selection transistor 604, FIG. 6) of the respective sensor is activated to provide the respective voltage, thereby allowing a measurement of a drain current of the respective sensor.

The method further includes measuring a drain current of the photo-sensing element (e.g., the photo-sensing element 602).

In some embodiments, the source terminals of the photo-sensing elements in the array of sensors concurrently receive respective voltages. For example, respective voltages are concurrently applied to multiple photo-sensing elements (e.g., photo-sensing elements in a same row) for a concurrent reading of the multiple photo-sensing elements.

In some embodiments, the source terminals of the photo-sensing elements in the array of sensors sequentially receive respective voltages. For example, respective voltages are sequentially applied to multiple photo-sensing elements (e.g., photo-sensing elements in a same column) for sequential reading of the multiple photo-sensing elements.

In some embodiments, the source terminals of photo-sensing elements in the array of sensors receive a same voltage.

In some embodiments, the drain currents of the photo-sensing elements in the array of sensors are measured in batches. For example, the drain currents of photo-sensing elements in a same row are measured in a batch (e.g., as a set).

In some embodiments, the drain currents of the photo-sensing elements in the array of sensors are concurrently measured. For example, the drain currents of the photo-sensing elements in a same row are concurrently measured.

In some embodiments, the drain currents of the photo-sensing elements in the array of sensors are sequentially measured. For example, the drain currents of the photo-sensing elements in a same column are concurrently measured.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An image sensor device, comprising:
an array of sensors, a respective sensor in the array of sensors including a sensor circuit, the sensor circuit including:
  a photo-sensing element, the photo-sensing element having a source terminal, a gate terminal, a drain terminal, and a body terminal, wherein the photo-sensing element comprises a light-sensing device that includes:
    a first semiconductor region doped with a dopant of a first type;
    a second semiconductor region doped with a dopant of a second type, wherein:
      the second semiconductor region is positioned above the first semiconductor region; and
      the first type is distinct from the second type;
    a gate insulation layer positioned above the second semiconductor region;
    a gate positioned above the gate insulation layer;
    a source electrically coupled with the second semiconductor region; and
    a drain electrically coupled with the second semiconductor region, wherein:
      the second semiconductor region has a top surface that is positioned toward the gate insulation layer;
      the second semiconductor region has a bottom surface that is positioned opposite to the top surface of the second semiconductor region;
      the second semiconductor region has an upper portion that includes the top surface of the second semiconductor region;
      the second semiconductor region has a lower portion that includes the bottom surface of the second semiconductor region and is mutually exclusive with the upper portion;
      the upper portion of the second semiconductor region extends from the source to the drain;
      the lower portion of the second semiconductor region extends from the source to the drain;
      the first semiconductor region is in contact with both the upper portion and the lower portion of the second semiconductor region; and
      the first semiconductor region is in contact with the upper portion of the second semiconductor region at least at a location positioned under the gate; and
  a selection transistor having a source terminal, a gate terminal, and a drain terminal, wherein the drain terminal of the selection transistor is electrically coupled with the source terminal of the photo-sensing element or the source terminal of the selection transistor is electrically coupled with the drain terminal of the photo-sensing element; and
a converter circuit, the converter circuit including:
  a first transimpedance amplifier having an input terminal electrically coupled with the source terminal or the drain terminal, of the selection transistor of the sensor circuit, that is not electrically coupled with the source terminal or the drain terminal of the photo-sensing element, the first transimpedance amplifier configured to convert a current input from the photo-sensing element into a voltage output; and a differential amplifier having two input terminals, a first input terminal of the two input terminals electrically coupled with the voltage output of the first transimpedance amplifier and a second input terminal of the two input terminals electrically coupled with a voltage source that is configured to provide a voltage corresponding to a base current provided by the photo-sensing element, the differential amplifier configured to output a voltage based on a voltage difference between the voltage output and the voltage provided by the voltage source.

2. The image sensor device of claim 1, wherein the first type is an n-type and the second type is a p-type.

3. The image sensor device of claim 1, wherein the first type is a p-type and the second type is an n-type.

4. The image sensor device of claim 1, wherein:
the second semiconductor region has a first lateral surface that extends from the source to the drain and is distinct from the top surface and the bottom surface;
the second semiconductor region has a second lateral surface that extends from the source to the drain and is distinct from the top surface and the bottom surface;
the first semiconductor region is in contact with the upper portion of the second semiconductor region through a portion of the first lateral surface; and
the first semiconductor region is in contact with the upper portion of the second semiconductor region through a portion of the second lateral surface.

5. The image sensor device of claim 1, wherein the first semiconductor region includes germanium.

6. The image sensor device of claim 1, wherein the second semiconductor region includes germanium.

7. The image sensor device of claim 1, wherein the gate insulation layer includes an oxide layer.

8. The image sensor device of claim 1, wherein the light-sensing device includes a substrate insulation layer positioned below the first semiconductor region, wherein the substrate insulation layer includes one or more of: $SiO_2$, $GeO_x$, $ZrO_x$, $HfO_x$, $Si_xN_y$, $Si_xO_yN_z$, $Ta_xO_y$, $Sr_xO_y$, and $Al_xO_y$.

9. The image sensor device of claim 1, wherein the light-sensing device includes a third semiconductor region that includes germanium doped with a dopant of the second type, wherein the third semiconductor region is positioned below the first semiconductor region.

10. The image sensor device of claim 9, wherein a doping concentration of the dopant of the second type in the second semiconductor region is higher than a doping concentration of the dopant of the second type in the third semiconductor region.

11. The image sensor device of claim 1, wherein the light-sensing device includes a silicon substrate.

12. The image sensor device of claim 1, wherein the gate includes one or more of: polygermanium, amorphous germanium, polysilicon, amorphous silicon, silicon carbide, and metal.

13. The image sensor device of claim 1, wherein the first semiconductor region extends from the source to the drain.

14. The image sensor device of claim 1, wherein the second semiconductor region defines multiple channels between the source and the drain.

15. The image sensor device of claim 1, wherein the second semiconductor region has a thickness less than 100 nm.

16. The image sensor device of claim 1, wherein the first semiconductor region has a thickness less than 1000 nm.

17. The image sensor device of claim 1, wherein the voltage source is a second transimpedance amplifier having an input terminal electrically coupled with a second sensor circuit that has a structure of the sensor circuit and is distinct from the sensor circuit.

18. The image sensor device of claim 17, wherein the photo-sensing element of the second sensor circuit is optically covered so that the photo-sensing element of the second sensor circuit is prevented from receiving light.

19. The image sensor device of claim 1, wherein the voltage source includes a digital-to-analog converter.

20. A method, comprising:
exposing the array of sensors of the image sensor device of claim 1 to a pattern of light; and,
for the photo-sensing element of a respective sensor in the array of sensors:
providing a respective voltage to the source terminal of the photo-sensing element of the respective sensor; and
measuring a drain current of the photo-sensing element.

* * * * *